United States Patent [19]

Miura et al.

[11] Patent Number: 5,644,500

[45] Date of Patent: Jul. 1, 1997

[54] ROUTING PROGRAM GENERATING METHOD AND APPARATUS THEREFOR, PLACEMENT PROGRAM GENERATING METHOD AND APPARATUS THEREFOR, AND AUTOMATIC ROUTING METHOD AND APPARATUS THEREFOR

[75] Inventors: Hiroshi Miura; Masato Ariyama; Kazuyuki Iida; Kazufumi Iwahara; Mitsunobu Okano; Hiroyuki Orihara; Akira Katsumata; Toshiyasu Sakata; Masaharu Nishimura; Hirofumi Hamamura; Naoki Murakami; Mitsuru Yasuda; Yasuhiro Yamashita; Ryouji Yamada; Atsushi Yamane, all of Kawasaki, Japan

[73] Assignee: Fujitsu Limited, Kawasaki, Japan

[21] Appl. No.: 673,472

[22] Filed: Jul. 1, 1996

Related U.S. Application Data

[63] Continuation of Ser. No. 380,795, Jan. 30, 1995, abandoned.

[30] Foreign Application Priority Data

Mar. 18, 1994 [JP] Japan .................................. 6-049109
Nov. 30, 1994 [JP] Japan .................................. 6-296469

[51] Int. Cl.⁶ .................................................. G06F 15/00
[52] U.S. Cl. .......................... 364/490; 364/488; 364/489; 364/491
[58] Field of Search .............................. 364/488, 489, 364/490, 491, 578; 257/206, 209, 211, 390; 327/566; 326/37

[56] References Cited

U.S. PATENT DOCUMENTS 4,593,351  6/1986  Hong et al. .......................... 364/200

(List continued on next page.)

FOREIGN PATENT DOCUMENTS 3-257674  11/1991  Japan .
4-286077  10/1992  Japan .

OTHER PUBLICATIONS

Setliff, Dorothy and Rutenbar, Rob; IEEE Transactions on Computer–Aided Design of Integrated Circuits and Systems; *On the Feasibility of Synthesizing CAD Software from Specifications: Generating Maze Router Tools in ELF*; vol. 10, No. 6; pp. 783 – 801; Jun. 1991.

(List continued on next page.)

*Primary Examiner*—Kevin J. Teska
*Assistant Examiner*—Jacques Louis-Jacques
*Attorney, Agent, or Firm*—Armstrong, Westerman, Hattori, McLeland & Naughton

[57] ABSTRACT

This invention is directed to a method and apparatus to find out an optimum solution in automatic routing or automatic placement with certainty and at a high-speed to improve a routing rate, and to realize automatic routing in a high-density. To these end, a routing approach is selected in a conversational mode while routing efficiency is consulted to compose routing processing procedure so as to generate a routing program. Besides, component placement processing procedures designated according to placement control information are combined to generate the placement program. A straight line between component pins adjacent to each other is defined as a chord, a wave for maze method routing is generated from a start point toward an end point of a routing path and propagated between the chords adjacent to each other. Positions of the chords through which the wave has passed until reaching the end point from the start point are successively stored and the positions through which the wave has passed is traced back to the start point from the end point when the wave reaches the end point to decide a routing path of the routing pattern. The method and apparatus of this invention are applicable to routing design or component placement design of LSIs, multichip modules, printed circuit boards, etc.

50 Claims, 28 Drawing Sheets

U.S. PATENT DOCUMENTS

| | | | |
|---|---|---|---|
| 4,593,363 | 6/1986 | Burstein et al. | 364/491 |
| 4,754,408 | 6/1988 | Carpenter et al. | 364/488 |
| 4,805,113 | 2/1989 | Ishii et al. | 364/490 |
| 4,876,656 | 10/1989 | Leicht et al. | 364/491 |
| 5,050,090 | 9/1991 | Golub et al. | 364/478 |
| 5,200,908 | 4/1993 | Date et al. | 364/491 |
| 5,465,218 | 11/1995 | Handa | 364/489 |
| 5,513,119 | 4/1996 | Moore et al. | 364/490 |
| 5,550,750 | 8/1996 | Wolff | 364/490 |

OTHER PUBLICATIONS

Setliff, Dorothy and Rutenbar, Rob; IEEE Transactions on Software Engineering; *Knowledge Representation and Reasoning in a Software Synthesis Architecture;* vol. 18, No. 6; pp. 523 – 533; Jun. 1992.

Setliff, Dorothy and Rutenbar, Rob; Proceedings: The Fourth Conference on Artificial Intelligence Applications; *Knowledge–Based Synthesis of Custom VLSI Physical Design Tools: First Steps*; No. 1988; pp. 102 – 108; Mar. 14, 1988.

Jonckers, Viviane; 5th International Workshop on Expert Systems and their Applications; *Knowledge Based Selections and Coordination of Specialised Algorithms;* pp. 1269 – 1281; 1985 Jan. 1985.

Simpson, Kevin; IEE Vacation School on 'Electronic Product Design'; *Use of AI Expert Systems in CAE/CAD. Brute Force and Intelligence: Automatic Placement of Components on PCBs;* pp. 18/1 – 18/10; Sep. 1987.

Soukup, Jiri; Proceedings of the IEEE/ACM International Conference on Computer Aided Design (ICCAD); *Maze Router Without A Grid Map*; pp. 382 – 385; Nov. 1992.

Mogaki, Masato et al; Proceedings of the 30th Design Automation Conference; *Cooperative Approach to a Practical Analog LSI Layout System*; pp. 544 – 549; Jun. 1993.

Venkateswaren, P. Mazumder, P.; I.E.E. Proceedings; Computers and Digital Techniques; *Chirps: a general–area parallel multilayer routing system*; vol. 142, No. 3; pp. 208 – 214; May 1995.

Proceedings of the 29th ACM/IEEE Design Automation Conference; *Liao et al.* 'Routing Considerations in Symbolic Layout Synthesis'; Jun. 1992; Anaheim, California, pp. 682–686.

Proeedings of the European Design Automation Conference '92; *Lienig et al.,* 'Routing Algorithms for Multi–Chip Modules'; Sep. 1992 Hamburg, pp. 286–291.

FIG. 10

| WHO 1 (CLOCK SYSTEM) | WHERE 1 (ON THE SURFACE LAYER) | HOW 1 (AT ROUNDABOUT=0) |
| --- | --- | --- |
| | | HOW 2 (AT ROUNDABOUT≦10) |
| | | HOW 3 (AT ROUNDABOUT>10) |
| | WHERE 2 (ON THE INNER LAYER) | HOW 1 (AT ROUNDABOUT=0) |
| | | HOW 2 (AT ROUNDABOUT≦10) |
| | | HOW 3 (AT ROUNDABOUT>10) |
| WHO 2 (GENERAL SIGNAL SYSTEM) | | |

FIG. 11

| HOW 1 (AT ROUNDABOUT=0) | WHO 1 (CLOCK SYSTEM) | WHERE 1 (ON THE SURFACE LAYER) |
| --- | --- | --- |
| | | WHERE 2 (ON THE INNER LAYER) |
| | WHO 2 (GENERAL SIGNAL SYSTEM) | WHERE 1 (ON THE SURFACE LAYER) |
| | | WHERE 2 (ON THE INNER LAYER) |
| HOW 2 (AT ROUNDABOUT≦10) | WHO 1 (CLOCK SYSTEM) | WHERE 1 (ON THE SURFACE LAYER) |

FIG. 12

| WHERE 1 (ON THE SURFACE LAYER) | HOW 1 (AT ROUNDABOUT = 0) | WHO 1 (CLOCK SYSTEM) |
|---|---|---|
| | | WHO 2 (GENERAL SIGNAL SYSTEM) |
| | HOW 2 (AT ROUNDABOUT ≤ 10) | WHO 1 (CLOCK SYSTEM) |
| | | WHO 2 (GENERAL SIGNAL SYSTEM) |
| | HOW 3 (AT ROUNDABOUT > 10) | WHO 1 (CLOCK SYSTEM) |

| WHICH ARE GROUPED | IN WHICH REGION | PLACING CONDITION |
|---|---|---|
| CONNECTOR COMPONENTS | ON THE UPPER SURFACE OF THE SUBSTRATE | PLACE FROM ONE HAVING LARGER OUTER DIMENSIONS |
| | ON THE LOWER SURFACE OF THE SUBSTRATE | PLACE FROM ONE HAVING LARGER OUTER DIMENSIONS |
| GENERAL COMPONENTS | | |

FIG. 23

| PLACING CONDITION | WHICH ARE GROUPED | IN WHICH REGION |
|---|---|---|
| PLACE FROM ONE HAVING THE LARGER NUMBER OF PINS | CONNECTOR COMPONENTS | ON THE UPPER SURFACE OF THE SUBSTRATE |
| | | ON THE LOWER SURFACE OF THE SUBSTRATE |
| PLACE FROM ON THE UPPER SURFACE OF THE SUBSTRATE | COMPONENTS HAVING A POWER-SOURCE NET | WITHIN A SUBSTRATE PLACING REGION |

FIG. 24

| IN WHICH REGION | WHICH ARE GROUPED | PLACING CONDITION |
|---|---|---|
| ON THE UPPER SURFACE OF THE SUBSTRATE | CONNECTOR COMPONENTS | PLACE FROM ONE HAVING THE LARGER NUMBER OF PINS |
| | CAPACITOR COMPONENTS | |
| | COMPONENTS HAVING A POWER-SOURCE NET | PLACE FROM ONE HAVING THE LARGER OUTER DIMENSIONS |

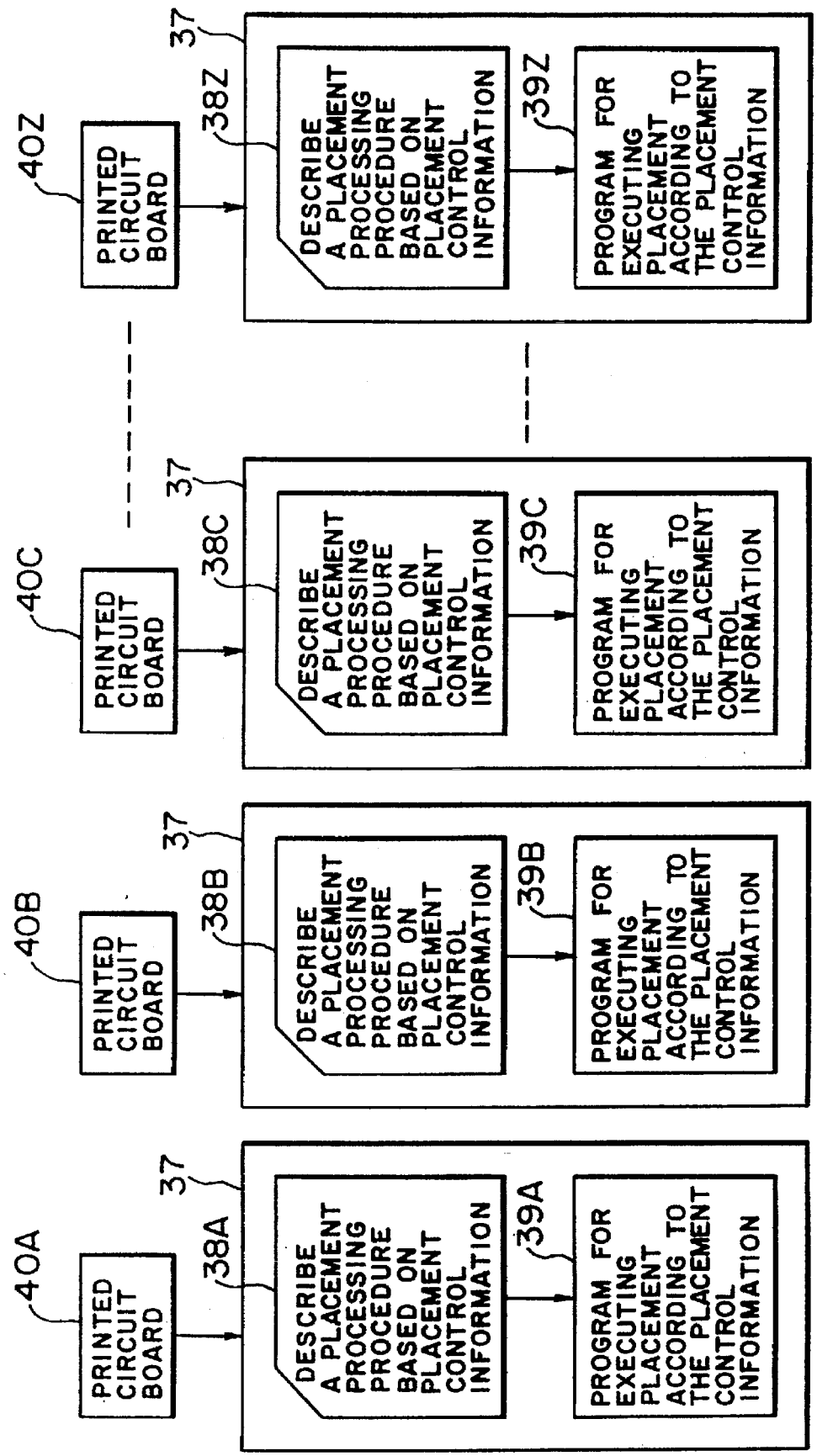

F I G. 27
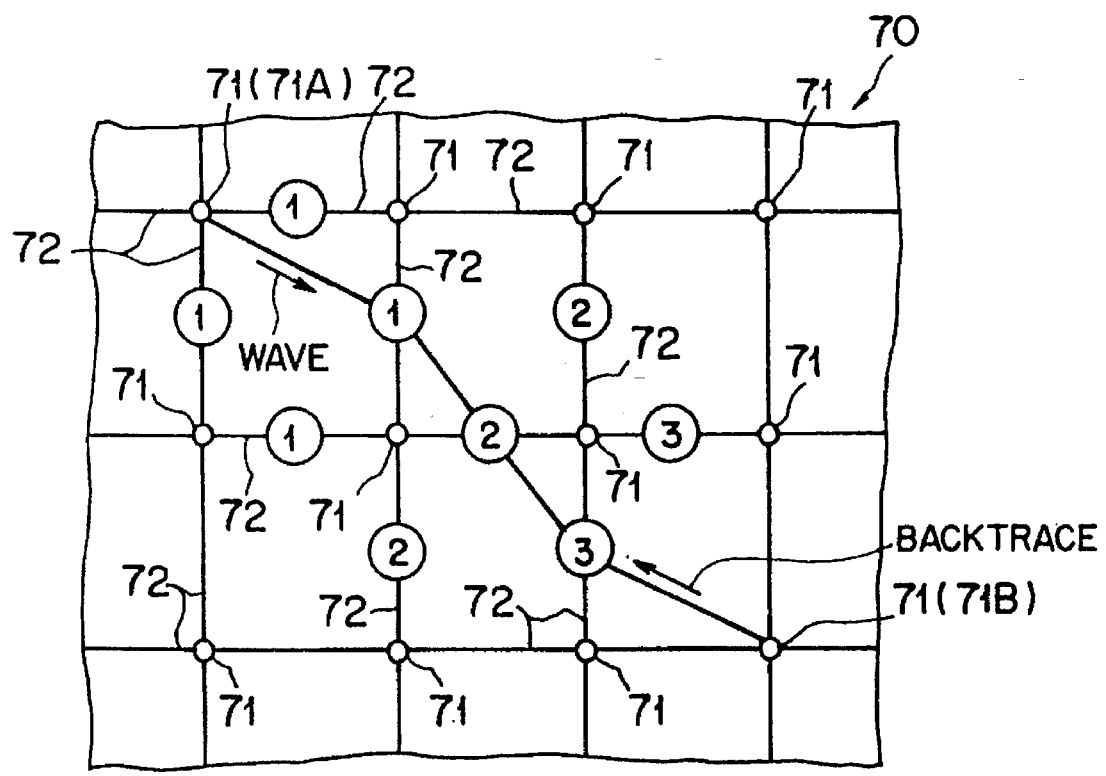

ROUTING PROGRAM GENERATING METHOD AND APPARATUS THEREFOR, PLACEMENT PROGRAM GENERATING METHOD AND APPARATUS THEREFOR, AND AUTOMATIC ROUTING METHOD AND APPARATUS THEREFOR

This application is a continuation of application Ser. No. 08/380,795, filed Jan. 30, 1995, now abandoned.

BACKGROUND OF THE INVENTION

1) Field of the Invention

The present invention relates to a method and apparatus composing a routing processing procedure (algorithm) on the basis of predetermined routing design data (routing problem) to generate a routing program, a method and apparatus composing a placement processing procedure (algorithm) for placing components upon the routing process to generate a placement program, and a method and apparatus for determining a routing path in order to route automatically a routing pattern on a circuit board having a number of component pins.

In fabrication of recent semiconductors (LSIs), multichip modules (MCMs), printed circuit boards or the like, there are demands for high-density packaging and placement, and routing accomplished within a short period of time on the less number of signal layers. With decrease of margin (a degree of freedom) due to a trend toward high-density and high-performance as above, it becomes difficult to solve various routing problems and placement problems with one fixed algorithm. For this, it is now necessary to establish high-performance automatic routing technique and automatic placement technique.

2) Description of the Related Art

In the automatic routing technique, a general-purpose automatic routing program 101 describing a predetermined routing processing procedure complies with routing problems (routing design data) of different sorts of printed circuit boards (or semiconductors such as LSIs or the like) 100A, 100B, . . . , 100Z, as shown in FIG. 33.

Likewise, in the automatic placement technique, a general-purpose automatic placement program 102 describing a predetermined placement processing procedure complies with problems of component placement on difference sorts of printed circuit boards (or semiconductors such as LSIs or the like) 100A, 100B, . . . , 100Z, as shown in FIG. 34.

Line search method or maze method are, for example, well known as general automatic routing means to determine routing paths to route automatically routing patterns on a circuit board having a number of component pins.

In the line search method, if two points to be interconnected with the routing pattern on the printed circuit board 110 are given as a start point (component pin) 111 and an end point (component pin) 112, as shown in FIG. 35, the routing path from the start point 111 to the end point 112 is determined in the following manner.

First, an appropriate direction to approach the end point 112 from the start point 111 is selected on the printed circuit board 110, and the first search line 113 is drawn from the starting point in that direction (rightward in an example shown in FIG. 35).

The first search line 113 cannot reach the end point 112, so the second search line 114 is drawn in an appropriate direction at right angles to the first search line 113 to approach the end point 112 (downward in the example shown in FIG. 35).

The second search line 114 cannot reach the end point 112 either because of a routing prohibited region (a part indicated by X marks in FIG. 35), so the third search line 115 at right angles to the second search line 114, the fourth search line 116 at right angles to the third search line 115, the fifth search line 117 at right angles to the fourth search line 116 are successively drawn from appropriate points on immediately above lines, in the same manner. Finally, the fifth search line 117 reaches the end point 112.

The first to fifth search lines 113–117 drawn in the above manner determine a routing path (indicated by a dot-dash line) 118 of a desired routing pattern from the start point 111 to the end point 112 on the printed circuit board 110.

On the other hand, in the maze method, if two points to be routed of a routing pattern are given as a start point (component pin) 121 and an end point (component pin) 122 on a printed circuit board 120 as shown in FIG. 36, a routing path from the start point 121 to the end point 122 is determined in the following manner.

In the maze method, meshes each having a pattern width of the routing pattern as a basic unit are imagined on the printed circuit board 120, and a wave is generated and propagated from the start point 121 toward the end point 122, as shown in FIG. 36.

As shown as an encircled number in each mesh in FIG. 36, meshes adjacent to a mesh in which the start number 121 locates are labelled (1), and the meshes adjacent to the meshes labelled (1) are labelled 2. In the same manner, the numbers are successively labelled to the meshes so that the routing path started from the start point 121 can reach the end point 122.

In an example shown in FIG. 36, a mesh in which the end point 122 locates is the eighth mesh counted from the start point 121, labelled a number (8). The meshes that the wave has passed through from the start point 121 to the end point 122 are successively stored. when the wave reaches the end point 122, the positions of the meshes that the wave has passed through are traced back to the start point 121 from the end point 122 so that the routing path 123 of the routing pattern is determined.

Incidentally, meshes labelled X marks represent a routing prohibited region in FIG. 36.

However, physical, electric design conditions become more strict due to trends to high-density packaging, low-cost and high-speed developed rapidly in recent years. For this, it becomes difficult to find out an appropriate solution as expected by the designer if automatic routing is carried out for a long time, which results in a lot of parts left unrouted.

The automatic routing technique using the general-purpose automatic routing program 101 as shown in FIG. 33 has a problem that the program 101 for solving problems describes only a certain limited routing processing procedure (algorithm) so that it is difficult to find out an optimum solution for each routing problem, although there are various routing problem (routing design data).

As above, the present situation is that it is hard to outlook the completion of the routing process within a given period of time even if manual routing is carried out on unrouted parts, so all parts are manually routed after all. As this, an application rate of the automatic routing is decreasing year after year.

Similarly, in the automatic placement technique using the general-purpose automatic placement program 102 as shown in FIG. 34, the program 102 for solving problems describes only a given limited routing processing procedure (algorithm) although recent substrates are diversified as noted above. For this, the present situation is that the component placement often results in against designer's expectations.

Therefore, the component placement resulted in against designer's expectation requires manual alteration. However, the present situation is that it is hard to outlook the completion of the routing process within a given period of time even if manual alteration is done in the component placement, so all the component placement has to be carried out manually. As this, an application rate of the automatic placement is decreasing year after year.

On the other hand, in the above-mentioned line search method shown in FIG. 35, the routing pattern is represented as succession of straight lines (see the search lines 113–117 and the routing path 118). When a judgement is made as to whether the pattern is passable or not, graphic operations are necessary to judge the positional relation of the straight lines, which graphic operations consume an enormous period of time. With this reason, sufficient search of the routing paths in the routing pattern has been difficult.

In the above-mentioned maze method shown in FIG. 36, since the pattern width is designated as a basic unit of the mesh, so a volume of the data become enormous as an area of the printed circuit plate 120 increases and the width of the pattern decreases. This causes an increase in the number of meshes used to search a passable route. This results in an enormous period of time to search a path.

Therefore, searches to determine a passable path have to be made on many paths and many combinations in order to route the routing pattern in the high-density. However, search at an unsufficient speed causes occurence of paths that have been left unsearched, which disturbs a high-density routing.

SUMMARY OF THE INVENTION

A first object of this invention is to provide a routing program generating method and apparatus therefore, which can readily obtain an individual routing program and a result of routing suitable for each of routing problems to find an optimum solution in automatic routing, with certainty and at a high-speed, even under severe conditions set to meet demands for high-density packaging and low-cost, thereby improving a routing rate.

A second object of this invention is to provide a placement program generating method and apparatus therefore, which can readily obtain an individual placement program and a result of placement suitable for each of placement problems to find an optimum solution in automatic placement, with certainty and at a high-speed, even under severe conditions set to meet demands for high-density packaging and low-cost without relying on human labour.

A third object of this invention is to provide an automatic routing method and apparatus therefore, in which automatic routing in a higher-density is accomplished by shortening a time period required to search a routing path, thereby increasing the number of cases of the search within a given time period.

To these ends, a routing program generating method according to this invention is to compose a routing processing procedure on the basis of predetermined routing design data so as to generate a routing program, characterized in that the routing processing procedure is composed by selecting routing approach in a conversational mode while routing efficiency is evaluated to generate said routing program.

A routing program generating apparatus according to this invention is to compose a routing processing procedure on the basis of predetermined routing design data so as to generate a routing program, comprising a routing efficiency evaluating means evaluating routing efficiency depending on a routing approach on the basis of said predetermined rouging design data, a display means displaying a result of evaluation made by said routing efficiency evaluating means, and a selecting means selecting a routing approach, the routing approach being selected by said selecting means in a conversational mode while said result of evaluation displayed on said display means is consulted to compose the routing processing procedure, thereby generating said routing program.

In the automatic program generating method and apparatus therefore according to this invention, the routing approach is selected in a conversational mode while a result of evaluation is consulted to compose a routing processing procedure so as to generate an exclusive routing program describing the routing processing procedure complying with each of various routing problems of objects to be routed. Automatic routing according to such routing program is helpful to find an optimum solution in the automatic routing, with certainty and at a high-speed, even under severe conditions set to meet demands for high-density packaging and low-cost, contributing to an improvement in routing rate and performance of electronic computers.

A placement program generating method according to this invention designates component placement processing procedures according to placement control information depending on said predetermined design data and said placed region upon placing a plurality of components within said placed region on the basis of predetermined design data, and combines said component placement processing procedures to generate a placement program for automatically placing said plural components within said placed region.

A placement program generating apparatus according to this invention is to generate a placement program for automatically placing a plurality of components within a placed region on the bases of predetermined design data, comprising a designating means designating component placement processing procedures depending on said predetermined design data and said placed region, said component placement processing procedures designated by said designating means being combined to generate a placement program for automatically placing said plural components within said placed region.

The placement program generating method and apparatus therefore according to this invention allow generation of an exclusive placement program describing the component placement processing procedure complying with each of various placement problems of objects of the placement by designating said placement processing procedure according to placement controlling information depending on predetermined design data and said placed region. This invention is helpful to find an optimum solution in automatic placement, with certainty and at a high-speed, even under severe conditions set to meet demands for high-density packaging and low-cost without relying on human labour.

An automatic routing method according to this invention is to decide a routing path of a routing pattern in order to automatically route said routing pattern on a circuit board having a number of component pins. The automatic routing method according to this invention defines a straight line connecting said component pins adjacent to each other as a chord, generates a wave for maze method routing from a start point toward an end point of said routing path, propagates said wave between said chords adjacent to each other, stores positions of said chords through which said wave has passed until reaching said end point from said start point, and traces the positions of said chords through which said wave has passed back toward said start point from said end point to decide the routing path of said routing pattern.

An automatic routing apparatus according to this invention is to decide a routing path of a routing pattern in order to automatically route said routing pattern on a circuit board having a number of component pins.

The automatic routing apparatus of this invention comprises:

a chord information forming means forming positional information about a chord that is a straight line connecting said component pins adjacent to each other on the basis of positional information about said component pins; and a maze routing control means generating a wave for maze method routing from a start point toward an end point of said routing path, propagating said wave between said chords adjacent to each other on the basis of information about said chords formed by said chord information forming means, storing positions of said chords through which said wave has passed until reaching said end point from said start point, and tracing said positions of said chords through which said wave has passed back to said start point from said end point when said wave reaches said end point to decide a routing path of said routing pattern.

According to the automatic routing method and apparatus therefore of this invention, a straight line connecting component pins adjacent to each other is defined as a chord, positional information about that chord is formed on the basis of positional information about the component pins so that a routing path of a routing pattern may be decided under a routing control in a maze method with such chord as an object. This invention is helpful to decide a routing path of a routing pattern within a short period of time, increasing the number of cases in search within a given period of time, realizing an automatic routing in an extremely high-density.

BRIEF DESCRIPTION OF THE DRAWINGS

FIG. 10 is a illustration of an example to designate routed object information (Who), routed place information (Where) and routing condition information (How) in that order in the first embodiment;

FIG. 11 is an illustration of another example to designate the routed object information (Who), the routed place information (Where) and the routing condition information (How) in that order in the first embodiment;

FIG. 12 is an illustration of still another example to designate the routed object information (Who), the routed place information (Where) and the routing condition information (How) in that order in the first embodiment;

FIG. 23 is an illustration of another example to designate the placed component grouping information, the placed region designating information and the placing condition information in that order in the first embodiment;

FIG. 24 is an illustration of still another example to designate the placed component grouping information, the placed region designating information and the placing condition information in that order in the first embodiment;

FIG. 25 is an illustration of an operation to generate a placement program according to the first embodiment;

FIG. 27 is an illustration showing an operation of the automatic routing apparatus according to the second embodiment;

DESCRIPTION OF THE PREFERRED EMBODIMENTS

(A) Description of Aspects of This Invention

Figure 1:
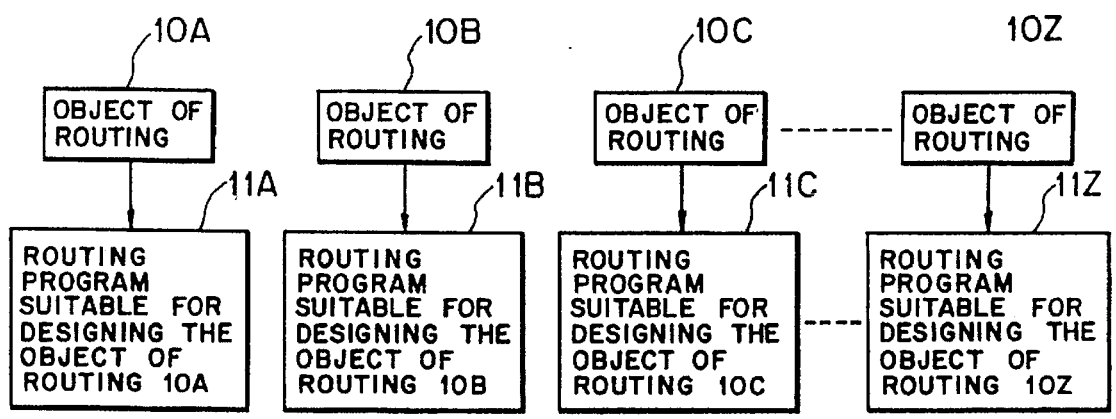
FIG. 1 is a block diagram showing an aspect of a routing program generating method according to this invention.

FIG. 1 is a block diagram showing an aspect of a method for generating a routing program according to this invention. In FIG. 1, reference numerals 10A through 10Z are objects to be routed thereon, which have different routing design data (routing problems based on design information of circuit boards for difference systems incompatible with each other). Reference numerals 11A through 11Z are routing programs generated according to this method, each of which describes a routing processing procedure complying with a routing problem of a corresponding routed object 10A–10Z.

According to the program generating method of this invention shown in FIG. 1, when a routing processing procedure is composed on the basis of predetermined routing design data to generate a routing program 11A–11Z, the routing processing procedure is composed by selecting a routing approach in a conversational mode while a routing efficiency of each of various routing problems (the routed objects 10A–10Z) is evaluated to generate the routing program 11A–11Z complying with each various routing problems.

It is possible to select the routing approach in the stage of package design on the basis of the predetermined routing design data to compose it as a result of the mounting design. It is alternatively possible to prepare the routing approach in advance as plural kinds of routing fundamental functions.

It is also possible to designate the routing processing procedure in a routing control language when the routing approach is selected. In this case, routed object information, routed place information, routing condition information and routing order information are designated as the routing control language.

Figure 2:
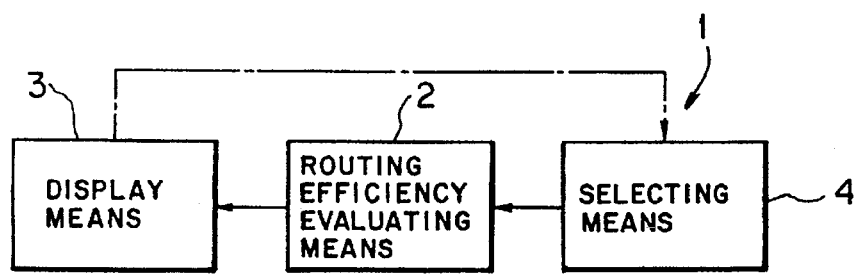
FIG. 2 is a block diagram showing an aspect of a routing program generating apparatus according to this invention.

FIG. 2 is a block diagram showing an aspect of a routing program generating apparatus according to this invention. In FIG. 2, reference numeral 1 denotes a routing program generating apparatus for composing a routing processing procedure (algorithm) on the basis of predetermined routing design data (routing problem) to generate the routing program 11A–11Z (referring to FIG. 1). The routing program generating apparatus 1 is configured with a routing efficiency evaluating means 2, a display means 3 and a selecting means 4.

The routing efficiency evaluating means 2 evaluates the routing efficiency according to the routing approach based on the predetermined routing design data. The display means 3 displays a result of evaluation made by the routing efficiency evaluating means 2. The selecting means 4 selects the routing approach.

In the routing program generating apparatus 1, the selecting means 4 selects the routing approach in a conversational mode while the results of the evaluation by the routing efficiency evaluating means 2 displayed on the display means 3 is referred to to compose the routing processing procedure, whereby the routing program 11A–11Z (refer to FIG. 1) is generated.

It is possible that the selecting means 4 selects the routing approach in the stage of package design based on the predetermined routing design data to compose the routing processing procedure as a result of the package design. Or, the routing approach above mentioned is prepared in advance as plural kinds of routing fundamental functions in the routing program generating apparatus 1.

Otherwise, it is possible to provide a designating means designating the routing processing procedure in a routing control language when the selecting means 4 selects the routing approach. In this case, the designating means designates the routing processing procedure by designating routed object information, routed place information, routing condition information and routing order information as the routing control language.

In the above-mentioned routing program generating method and apparatus shown in FIGS. 1 and 2, the selecting means 4 selects the routing approach in a conversational mode while a result of the evaluation made by the evaluation means 2 displayed on the display means 3 is referred to to compose the routing processing procedure so that the customized exclusive routing program 11A–11Z describing the routing processing procedure complying with each of various routing problems of the routed objects 10A–10Z.

The selection of the routing approach by the selecting means 4 in the stage of package design based on the predetermined routing design data allows the routing processing procedure to be composed in parallel with the package design, and the customized, exclusive routing program 11A–11Z complying with each of various routing problems of the object of the routing 10A–10Z in simultaneous with finish of the package design without paid a special attention by the routing designer.

The preparation of the routing manner as plural kinds of routing fundamental functions in advance allows the customized, exclusive routing program 11A–11Z to be easily generated by selecting or combining the routing fundamental functions depending on individual component placement or design requirement specification.

Further, the designating means designates the routing processing procedure by designating a routing control language [routed object information (Who), routed place information (where), routing condition information (How) and routing order information (When)] when the selecting means 4 selects the routing manner so that an optimum routing program 11A–11Z may be generated for such a region where routing is particularly difficult and automatic routing cannot be accomplished only by selecting or combining the routing fundamental functions.

The routing program generating method and apparatus according to this invention select the routing approach in a conversational mode while a result of evaluation is referred to to combine a routing processing procedure, thereby generating the exclusive routing program 11A–11Z describing the routing processing procedure complying with each of routing problems of the routed objects 10A–10Z to conduct automatic routing according to the routing processing procedure. This is effective to find an optimum solution in automatic routing even under severe design conditions set to meet demands such as high-density packaging and low-cost, contributing an improvement in routing rate or in performance of an electronic computer.

The route designer does not directly form the routing processing procedure, but a routing processing procedure described in the routing control language is automatically generated when an evaluation is made on the component placement in the package design. Without attention by the route designer, the routing processing procedure may be composed simultaneously with completion of the package design, and the exclusive routing programs 11A–11Z customized for various routing problems may be generated within an extremely short period of time.

As the routing manner is prepared as plural kinds of routing fundamental functions, it is possible to readily generate the exclusive routing program 11A–11Z only by selecting and combining the routing fundamental functions according to the individual component placement or design requiring specification.

Upon selecting the routing manner, a routing control language (routed object information, routed place information, routing condition information, routing order information) is designated to designate a routing processing procedure so that an optimum routing program 11A–11Z may be generated for a region where routing is very difficult and automatic routing is incapable only by selection and combination of the routing fundamental functions.

Figure 3:
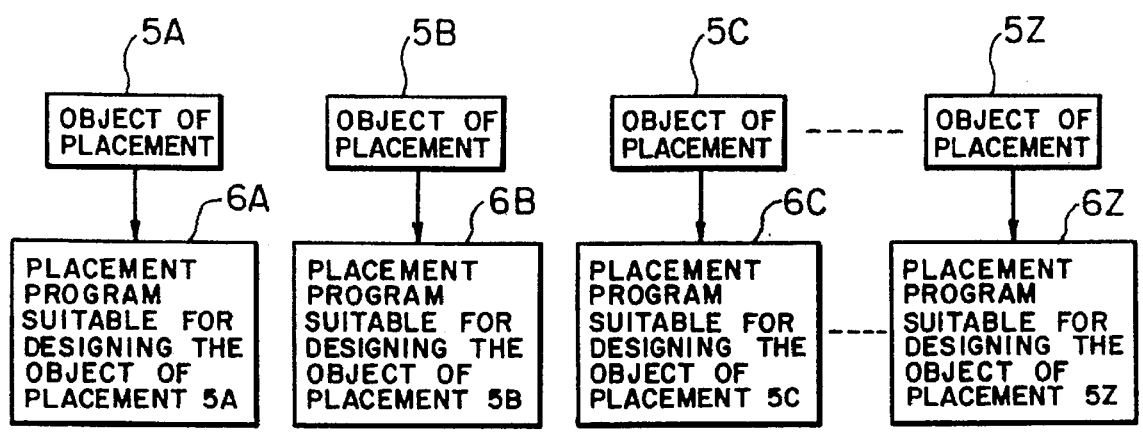
FIG. 3 is a block diagram showing an aspect of a placement program generating method according to this invention.

FIG. 3 is a block diagram showing an aspect of an automatic program generating method according to this invention. In FIG. 3, reference numerals 5A through 5Z are objects to be placed, which have different design data (placement problems based on design information of circuit boards for different systems incompatible with each other), 6A through 6Z are placement programs generated according to this invention. Each of the placement programs 6A–6Z describes a routing processing procedure complying with a placement problem of the corresponding routed object 5A–5Z.

More specifically, the placement program generating method of this invention shown in FIG. 3 designates a component placement processing procedure according to placement control information for each of various placement problems (placed objects 5A–5Z) depending on. predetermined design data and a region to be placed upon placement of a plurality of components within the placed region on the basis of predetermined design data, composes the designated component placement processing procedure to generate the placement program 6A–6Z for automatically placing a plurality of components within the placed region.

As placement control information, there are designated placed component grouping information, placed region designating information, placing condition information and group placing order information.

Figure 4:
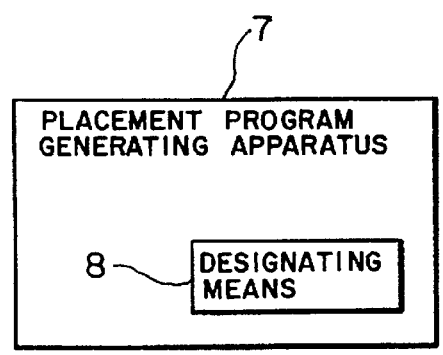
FIG. 4 is a block diagram showing an aspect of a placement program generating apparatus according to this invention.

FIG. 4 is a block diagram showing an aspect of a placement program generating apparatus according to this invention. In FIG. 4, reference numeral 7 denotes a placement program generating apparatus, which composes a placement processing procedures on the basis of predetermined design data (placement problem) to generate a placement program 5A–5Z (referring to FIG. 3). The placement program generating apparatus 7 of this invention has a designating means 8 designating component placement processing procedure according to placement control information depending on predetermined design data and a placed region.

The placement program generating apparatus 7 composes the component placement processing procedure designated by the designating means 8 to generate a placement program 6A–6Z (referring to FIG. 8) for automatically place a plurality of components within a placed region.

At this time, the designating means 8 designates placed component grouping information, placed region designating information, placing condition information and group placing order information, as placement control information.

The placement program generating method and apparatus therefore of this invention shown in FIGS. 3 and 4 combine the component placement processing procedures designated by the designating means 8 to generate a customized, exclusive placement program 6A–6Z describing a component placement processing procedure complying with a placement problem of each of the placed objects 5A–5Z.

At this time, the designating means 8 designates placement control information (placed component grouping information, placed region designating information, placing condition information and group placing order information) to designate a component placement processing procedure, thereby always generating an optimum placement program 6A–6Z.

In the placement program generating method and apparatus of this invention, a component placement processing procedure is designated on the basis of placement control information depending on predetermined design data and a placed region to generate an exclusive placement program 6A–6Z describing the component placement processing procedure complying with each of placement problems of the placed objects 5A–5Z. Automatic placement carried out according to each of the placement programs 6A–6Z allows to find out an optimum solution with certain and at a high-speed, without relying on human labour even under severe design conditions set to meet demands for high-density packaging and low-cost.

At this time, the routing control language (placed component grouping information, placed region designating information, placing condition information and group placing order information) is designated to designate a component placement processing procedure, thereby generating a routing program 6A–6Z most suitable for each of the placed objects.

Figure 5:
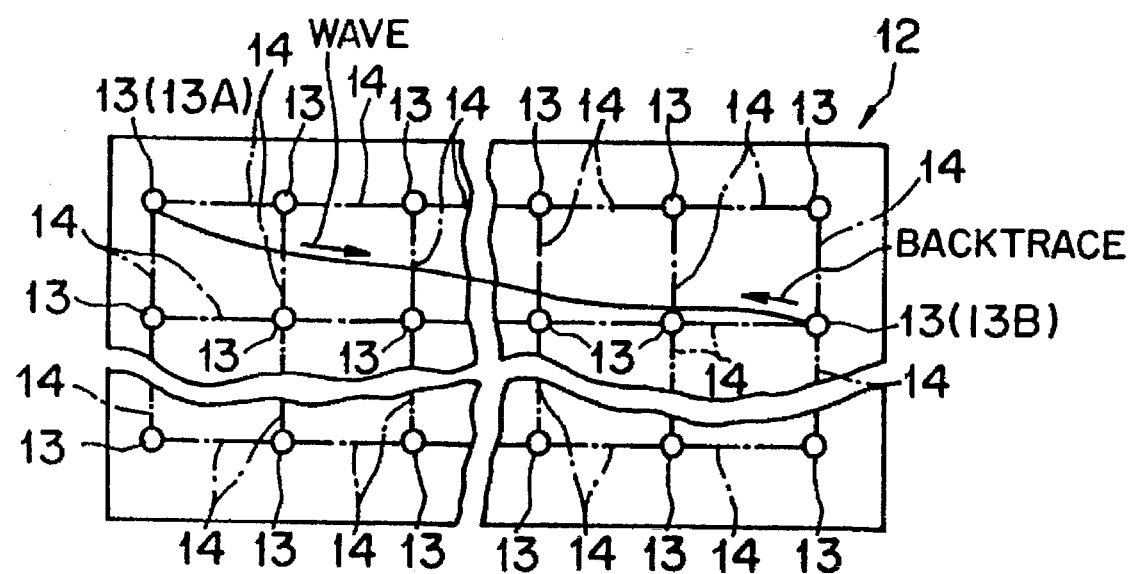
FIG. 5 is an illustration showing an aspect of an automatic routing method according to this invention.

FIG. 5 is an illustration showing an aspect of this invention. In FIG. 5, reference numeral 12 denotes a circuit board, reference numerals 13, 13A and 13B are a number of component pins on the circuit board 12, the reference numeral 14 is a straight line connecting adjacent component pins 13 (13A,13B) defined as a chord.

An automatic routing method of this invention shown in FIG. 5 defines a straight line connecting the adjacent component pins 13 (13A,13B) as the chord 14, generates a wave for maze method routing from a start point (component pin) 13A toward an end point (component pin) 13B of a routing path 15, propagates the wave between adjacent chords 14, stores positions of the chords 14 through which the wave passes until reaching the end point 13B from the start point 13A, traces the positions of the chords 14, through which the wave has passed, back to the start point 13A from the end point 13B when the wave reaches the end point 13B, and determines the routing path 15 of a routing pattern.

When propagating the wave between the adjacent two chords 14, it is possible to judge passability of the routing pattern on the basis of a capacity between two component pints 13 (13A,14B) forming the chord 14.

In the above case, a total sum of a line width of the routing pattern passing through the chord 14 in this wave propagation and line widths of routing patterns that have been permitted to pass through that chord 14 is calculated, and the total sum of the widths is compared with a distance between the component pins 13 (13A,13B) forming that chord 14. If the total sum of the widths is smaller than that distance, pass of the routing pattern is permitted.

If a plurality of routing patterns are permitted to pass through the chord 14, a position through which each of the routing patterns passes is stored as a relative position on that chord 14. When at least two routing patterns pass through adjacent chords 14, crossing of the routing patterns is judged on the basis of relative positions of the respective routing patterns on those adjacent chords 14.

After all routing paths 15 of the routing patterns on a circuit board 12 have been decided, it is possible to allocate the routing patterns passing through the chord 14 at equal spacings between the component pins 13 (13A,13B).

Figure 6:
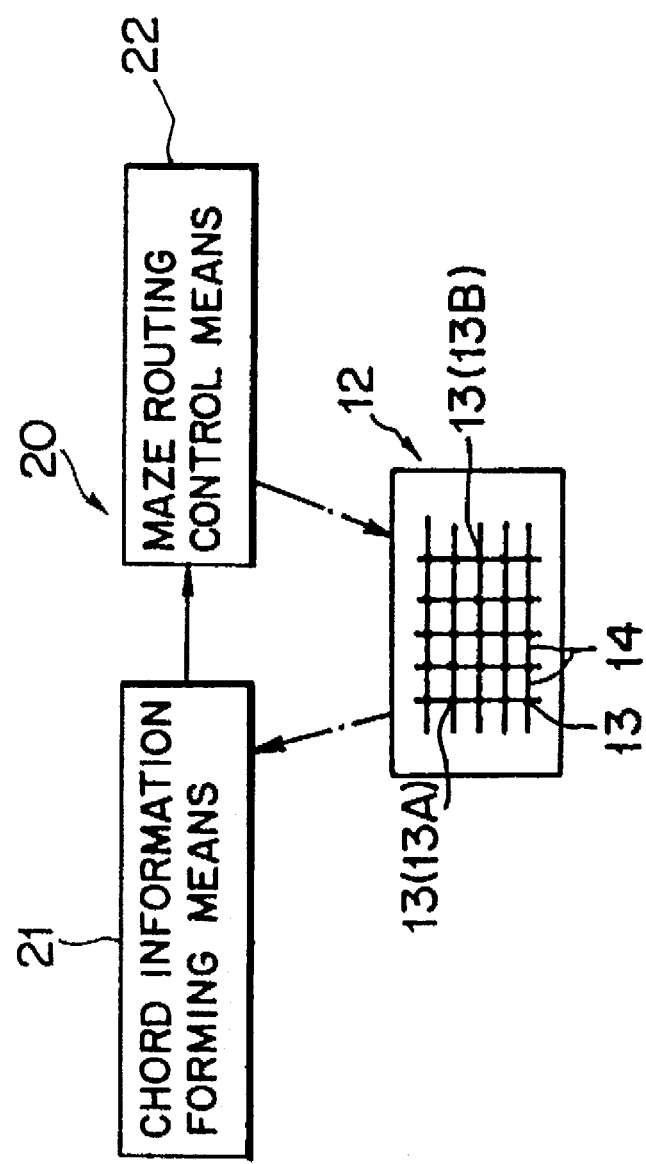
FIG. 6 is a block diagram showing an aspect of an automatic routing apparatus according to this invention.

FIG. 6 is a block diagram showing an aspect of the automatic routing apparatus of this invention. In FIG. 6, reference numeral 20 denotes an automatic routing apparatus, which decides routing paths 15 (referring to FIG. 5) to automatically route routing patterns on a circuit board 12 (referring to FIG. 5) having a number of component pins 13,13A and 13B (referring to FIG. 5). The automatic routing apparatus 20 of this invention has a chord information generating means 21 and a maze routing control means 22.

The chord information forming means 21 forms positional information about the chord 14 (referring to FIG. 5) that is a straight line connecting adjacent component pins 13 (13A, 13B) on the basis of positional information about the component pins 13 (13A,13B).

The maze routing control means 22 generates a wave for maze method routing from a start point 13A toward an end point 13B of a routing path 15, propagates the wave between adjacent chords 14 on the basis of information about the chords 14 formed by the chord information forming means 21, stores positions through which the wave passes until reaching the end point 13B from the start point 13A, traces the positions, through which the wave has been passed, back to the start point 13A from the end point 13B when the wave reaches the end point 13B to decide a routing path 15 of the routing pattern.

Incidentally, when the wave is propagated between the adjacent chords 14 by the maze routing control means 22, it is possible to provide a passability judging means in the automatic routing apparatus 20 to judge passability of the routing pattern on the basis of a capacity between the adjacent component pins 13 (13A,13B) forming that chord 14.

In the above case, the passability judging means is configured with an adding means calculating a total sum of a line width of the routing pattern passing through the chord 14 in this wave propagation and line widths of routing patterns that have been permitted to pass through that chord 14, a comparing means comparing the total sum of the line widths calculated by the adding means with a distance between the adjacent component pins 13 (13A,13B) forming that chord 14, and a judging means permitting pass of the routing pattern when the total sum of the line widths is smaller than that distance.

If the passability judging means permits pass of plural routing patterns through the chord 14, a position through which each of the routing patterns passes is stored as a relative position on that chord 14. The automatic routing apparatus 20 may includes a crossing judging means judging, when at least two routing patterns pass through adjacent two chords 14, crossing of the routing patterns on the basis of the relative positions of the respective routing patterns on those adjacent chords 14.

The automatic routing apparatus 20 may further includes an equally spacing means, which spaces routing patterns at equal spacings between two component pins 13 (13A,13B) after the maze routing control means 22 has decided all routing paths 15 of routing patterns on the circuit board 12.

In the automatic routing method and apparatus shown in FIGS. 5 and 6, the chord information forming means 21, first, defines a straight line connecting adjacent component pins 13 (13A,13B) as a chord 14. Positional information about that chord 14 is formed on the basis of positional information about the component pins 13 (13A,13B).

The maze routing control means 22 generates a wave for maze method routing from a start point (component pin) 13A toward an end point (component pin) 13B of a routing path 15, propagates the wave between adjacent chords 14, successively stores positions through which the wave passes until reaching the end point 13B from the start point 13A, traces the positions, through which the wave has passed, back to the start point 13A from the end point 13B when the wave reaches the end point 13B to determine a routing path 15 of the routing pattern.

Without use of rectangular meshes relying on a width of a routing pattern, use of chord 14 whose basic unit is a distance between two pins 13 larger than the width of a routing pattern allows a routing path 15 of a routing pattern to be decided within a short period of time.

When the maze routing control means 22 propagates a wave between adjacent chords 14, the passability judging means judges passability of a routing pattern on the basis of a capacity between component pins 13 (13A,13B) forming that chord 14, thereby preventing the unroutable number of routing patterns from passing between the component pins 13 (through that chord 14), and allowing a judgement as to passability of that routing pass within a short period of time.

In the above case, the adding means calculates a total sum of a line width of a routing pattern passing through the chord 14 in this wave propagation and line widths of routing patterns that have been permitted to pass through that chord 14 up to this wave propagation, the comparing means compares the total sum of the line widths with a distance between the component pins 13 (13A,13B) forming that chord 14, the judging means permits pass of the routing pattern when the total sum of the line widths is smaller than that distance, thereby preventing routing patterns having a width in excess of the distance between the component pins 13 (a length of the chord 14) from passing.

If the passability judging means permits pass of a plurality of routing patterns through the chord 14, the automatic routing apparatus 20 stores a position on that chord 14 through which each of the routing patterns passes as a relative position on that chord 14 so as to handle positions of routing patterns that have been permitted to pass as relative positions on that chord 14. If a new routing pattern is permitted to pass between those component pins 13 (13A,13B) (through that chord 14), this is helpful to readily move positions of existing routing patterns and to readily insert the new routing pattern.

If at least two routing patterns pass through adjacent chords 14, the crossing judging means may easily judges crossing of the routing patterns without any complex operations on the basis of relative positions on the adjacent chords 14 of each of the routing patterns by storing positions on those chords 14 through which the plural routing patterns pass as relative positions, as stated above.

After the maze routing control means 22 has decided all routing paths of the routing patterns on the circuit board 12, the equally spacing means automatically spaces the routing patterns passing through the chord 14 at equal spacings between the component pins 13 (13A,13B).

As above, the automatic routing. method and apparatus of this invention define a straight line connected adjacent component pins 13 (13A,13B) as a chord 14, form positional information about the chord 14 on the basis of positional information about the component pins 13 (13A,13B) to decide a routing path 15 of the routing pattern under a routing control in the maze method with the chord 14 as an object. It is, therefore, possible to decide the routing path 15 of the routing pattern within a short period of time, to increase the number of searches accomplished within a given period of time, and to realize an automatic routing in an extremely high-density.

When a wave for maze method routing is propagated between adjacent chords 14, passability of a routing pattern is judged on the basis of a capacity between component pins 13 (13A,13B) forming that chord 14. This may prevent an unroutable number of routing patterns from passing between the component pins 13 (13A,13B), enable a judgement as to passability of routing patterns to be made within an extremely short period of time, and contribute further high-density packaging in the automatic routing.

In this case, it is possible to judge passability of a routing pattern only by calculating a total sum of a line width of a routing pattern passing through the chord 14 in this wave propagation and line widths of routing patterns that have been permitted to pass up to this wave propagation, and cpmparing the total sum of the line widths with a length of the chord 14. This can simplify a judgement as to passability of the routing pattern and shorten a time period required to search a routing path 15.

If a plurality of routing patterns pass through the chord 14, positions on that chord through which the routing patterns pass are stored as relative positions on that chord so as to handle the positions of the routing patterns that have been permitted to pass as relative positions on that chord 14. If a new routing pattern is permitted to pass between the component pins, it is, therefore, possible to easily move the positions of the existing routing patterns, and to easily insert the new routing pattern. This is helpful to conduct a search for a routing path 15 within a short period of time.

If at least two routing patterns pass through adjacent chords 14, it is possible to easily judge as to crossing of the routing patterns on the basis of relative positions on those adjacent chords 14 of each routing pattern without any complex operations. If pass of a new path 15 is decided in a middle stage of the maze routing process, it is sufficient to store a position through which the routing path 15 passes and additionally register the new routing path 15 as a relative position with respect to an existing routing path 15. In the final stage where all youting paths 15 on the circuit board 12 have been decided, the routing patterns passing through the chord 14 are automatically equally spaced between the component pins 13 (13A,13B), and absolute positions of the routing patterns are calculated and decided, whereby a search for the routing path 15 may be carried out within a shorter period of time.

Figure 7:
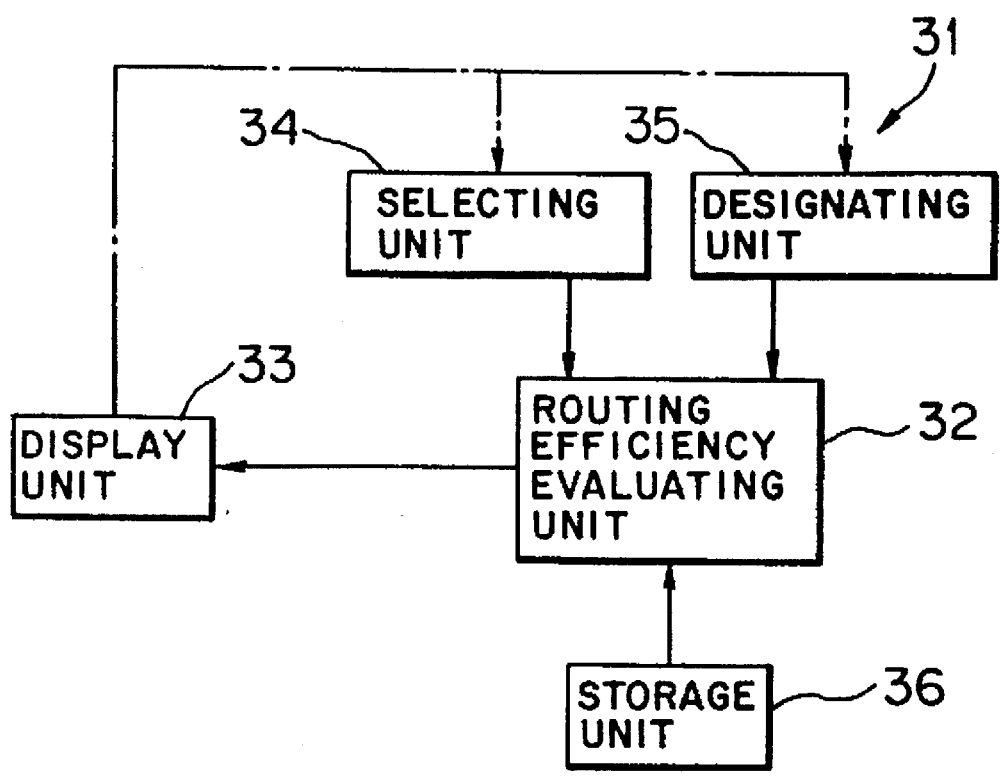
FIG. 7 is a block diagram of a routing program generating apparatus according to a first embodiment of this invention.

(B) Description of a Routing Program Generating Method According to First Embodiment FIG. 7 is a block diagram of a routing program generating apparatus according to a first embodiment of this invention.

Figure 15:
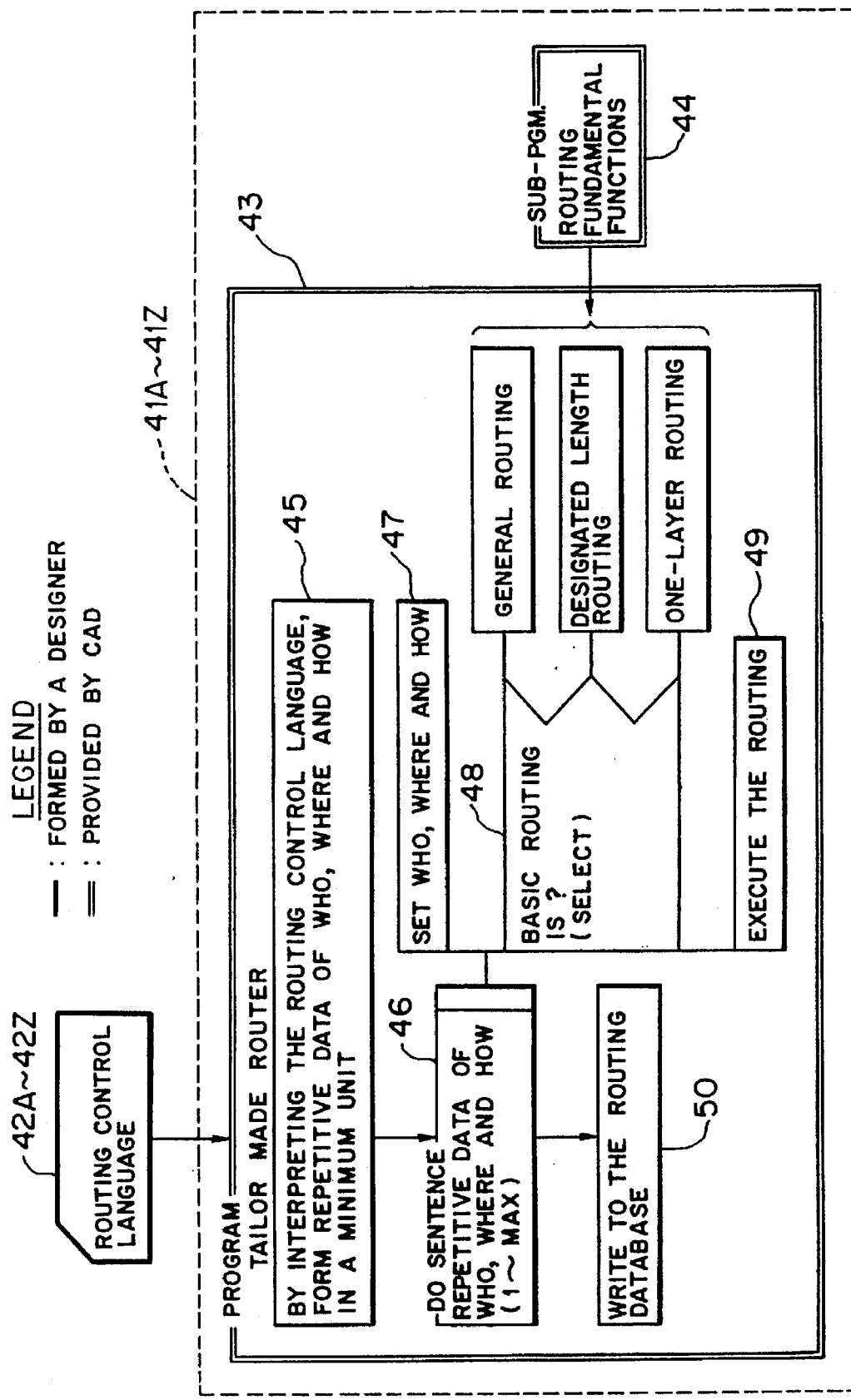
FIG. 15 is a detailed block diagram of the means for generating an automatic routing program in an execute form according to the first embodiment.

In FIG. 7, the routing program generating apparatus 31 composes a routing processing procedure (algorithm) on the basis of predetermined routing design data (routing problem) to generate an automatic routing program (see reference numerals 41A through 41Z in FIG. 15). The routing program generating apparatus 31 according to this embodiment has a routing efficiency evaluating unit 32, a display unit 33, a selecting unit 34, a designating unit 35 and a storage unit 36.

The routing efficiency evaluating unit 32 evaluates a routing efficiency corresponding to a routing approach on the basis of predetermined routing design data. The display unit 33 displays a result of evaluation made by the routing efficiency evaluating unit 32. The selecting unit 34 selects the routing approach (routing fundamental functions). In this embodiment, the routing approach (for example, general routing, power-source routing, specified length routing, one-layer routing, multilayer routing, bundle routing, etc.) is prepared beforehand in the storage unit 36 as plural kinds of routing fundamental functions.

The designating unit 35 designates the routing processing procedure by designating 3W1H, that is, routed object information (Who), routed place information (Where), routing condition information (How) and routing order information (When) as a routing control language when the selecting unit 34 selects the routing approach.

Figure 8:
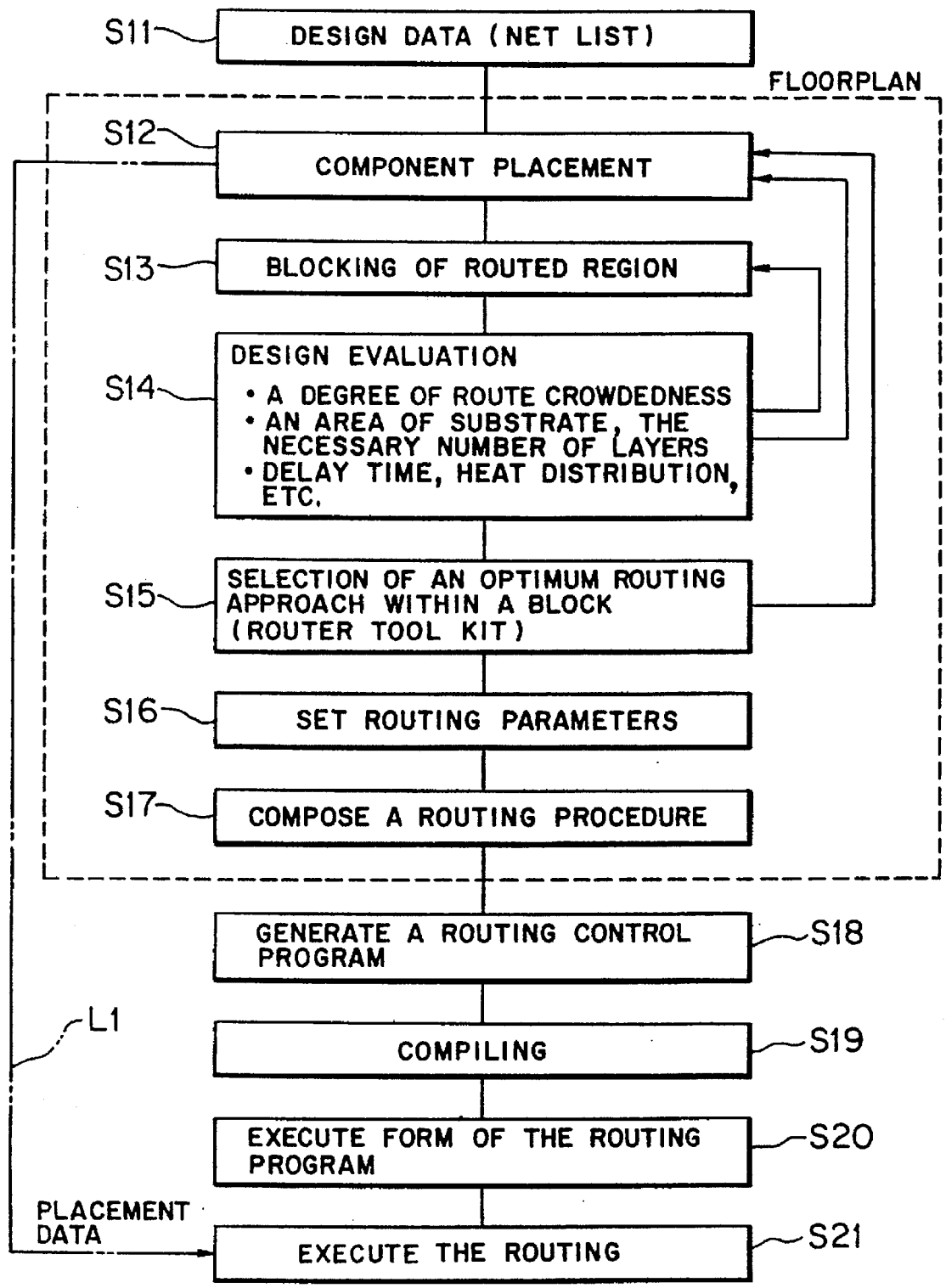
FIG. 8 is a flowchart for illustrating an operation of the routing program generating apparatus according to the first embodiment.
Figure 9:
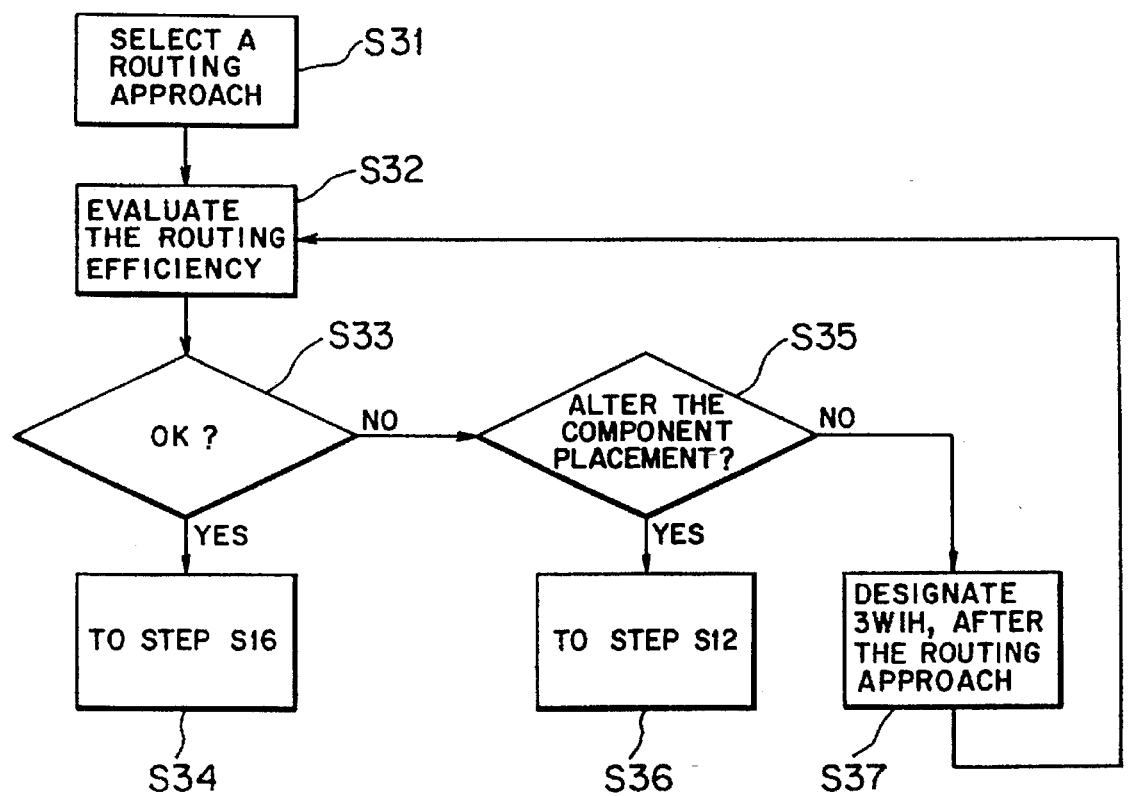
FIG. 9 is a flowchart for illustrating the operation of the routing program generating apparatus according to the first embodiment.

In the routing program generating apparatus 31 of this embodiment, the designer (operator) selects the routing approach through the selecting unit 34 or designates the routed object information (Who), the routed place information (Where), the routing condition information (How) and the routing order information (When) as the routing control language through the designating unit 35, in a conversational mode while referring a result of the evaluation made by the routing efficiency evaluating unit 32 displayed on the display unit 33 to compose the routing processing procedure while storing it as a result of a floorplan, in a stage of the package design (floorplan) based on predetermined routing design data so as to generate the automatic routing program (see reference numerals 41A41Z in FIG. 13), as described later referring to FIGS. 8 and 9.

The routing program generating apparatus 31 of this embodiment stated above is realized with a general personal computer or the like. The display unit 33 stated above is realized with a display such as a CRT or the like, the selecting unit 34 and the designating unit 35 are realized with a keyboard, the storage unit 36 is realized with a RAM, ROM or the like and the routing efficiency evaluating unit 32 is realized with an operation of a CPU according to a program stored in a ROM or the like.

A routing program generating method accomplished in the routing program generating apparatus 31 having the above configuration will be next described referring to flowcharts in FIGS. 8 and 9, and FIGS. 10 through 15.

When the routing design data (a routing problem, a net list) are given (Step S11 in FIG. 8), the routing control language is stored to compose the routing processing procedure (algorithm) in the course of proceeding a floorplan based on the routing design data (Steps S12 through S17 in FIG. 8), as follows.

If the object to be routed thereon is a printed circuit board (see reference numerals 40A–40Z in FIG. 13) initial placement of components is. carried out on the basis of the routing design data (Step S12 in FIG. 8), a routed area is the divided into blocks (Step S13 in FIG. 8). Thereafter, while making design evaluation on various parameters (a degree of route crowdedness, an area of substrate, a required number of layers, a delay time, heat distribution, etc.)(Step S14 in FIG. 8) alteration in component placement (Step 12 in FIG. 8) and the blocking of the routed area (Step S13 in FIG. 8) are repeated to improve the placement of various components in order to obtain an optimum design evaluation.

In the course of such placement improving process in the floorplanning, this embodiment makes it possible to compose (program) a routing processing procedure (algorithm) for the entire routed substrate (printed circuit board) while forming the floorplan by selecting an approach (tool) most suitable for the condition among tool kits (routing fundamental functions) corresponding to various routing approaches prepared in advance for a routed net or group having been blocked in Step S13, or by altering the routing or the placement of the components designated with above-mentioned 3W1H (routing control language) for a region where the routing is difficult (Step S15 in FIG. 8).

Here, the process at Step S15 will be described in more detail referring to FIG. 9. When the selecting unit 34 selects the routing approach (routing fundamental functions) (Step S31), the routing efficiency evaluating unit 32 evaluates the routing efficiency of the routing approach having been selected by the selecting unit 34 (Step S32).

A result of the evaluation made by the routing efficiency evaluating unit 32 is judged (Step S33). If the result is torelable, the procedure proceeds to Step S16 in FIG. 8. If the result is intorelable, a judgement is made as to whether there is necessity to alter the component placement (Step S35).

If the alteration in the component placement is necessary, the procedure returns to above-described Step S12 in FIG. 8 (Step S36). If the alteration is unnecessary, the designating unit 35 designates 3W1H (routing control language) to alter the routing, or the selecting unit 34 executes alteration in selection and combination of the routing approach (routing fundamental functions) (Step S37).

In a general automatic routing technique, 3W1H [routed object information (Who): which netgroup, routed place information (Where): in which layer or region; routing condition information (How): under which routing conditions; routing order information (When): in which order] are arranged (programmed) on the basis of routing know-how of the past. There are, however, some cases in particular printed circuit boards where the above fixed arrangement yields no optimum result.

According to this embodiment, designation of the above 3W1H by the designating unit 35 permits easy alteration in the routing so that an optimum rearrangement depending on a property of each printed circuit board (see reference numerals 40A–40Z in FIG. 13) is available. More specifically, the general automatic routing technique is incorporated 3W1H in advance, contents of which are only items not relying on the contents of individual routing design data. This embodiment, however, allows designation and alteration with 3W1H even in the information relying on contents of the individual routing design data to yield easily an optimum result of the routing.

Practical contents (items) of 3W1H designated by the designating unit 35 are as follows:

(a) Designated items of Who (routed object information: Who: Which netgroup):

net name;
a part of net name;
a plurality of nets;

page in the circuit unit;
designation of a specific block in the circuit diagram;
name of a packaging position of a component carried on the printed circuit board;
types of components carried on a part of the printed circuit board of the name of the packaging position of the component carried on the printed circuit board (LSI, resistor, connector, etc.);
shapes of components carried on the printed circuit board (QFP, SOP, DIP, etc.);
number of pins of the components carried on the printed circuit board (2 pins, 16 pins, 256 pines, etc.);
positions (coordinates) of the component pins carried on the printed circuit board;
the number of signal pins belonging to one net;
net(s) belonging to a range of a line length on a logical line length basis;
attributes of signals (for example, clock system, general signal system, test signal system, etc.);
routing restriction (for example, a designated length routing, routing layer designation, etc.);

(b) Designated items of Where (routed place information: where: in which layer or in which region)

routed layer;
routable region;
routing inhibited region;

(c) Designated items of How (routing condition information: how: in which conditions)

length of roundabout;
if designated a maximum line length, within the maximum line length;
if designated a minimum line length, within a range not less than the minimum line length;
if designated a maximum line length and a minimum line length, within a range of these line lengths;

(d) When (routing order information: when: in which order)

the order appearing the net groups designated in Who;

According to this embodiment, it is possible to designate each items of the above 3W1H independently by the designating unit 35. It is also possible to set OR condition or AND condition to a plurality of the items. As this, this embodiment makes designation of a routing processing procedure most suitable for each design condition possible.

This embodiment has no particular restriction on the arrangement of the routed object information (Who), the routed place information (Where) and the routing condition information (How) designated by the designating unit 35, making a routing processing procedure most suitable for each design information possible, as well.

FIGS. 10 through 12 show practical examples of designation of the routed object information (Who), the routed place information (Where) and the routing condition information (How), wherein the routing order information (When) is designated as the order of appearance of the net groups designated in the routed object information (Who).

In an example of designation shown in FIG. 10, the designation is made in the order of the routed object information (Who), the routed place information (Where) and the routing condition information (How). This is an example of a routing requirement where the routed object information is given top priority. This example is a design requirement attaching an importance to complete the net in the clock system prior to the general signal system, and is a routing processing procedure meeting that requirement as well.

In an example of designation shown in FIG. 11, the designation is made in the order of the routing condition information (How), the routed object information (Who), the routed place information (Where). This is an example of a routing requirement where the routing condition information (How) is given top priority. In this example, there is shown a routing requirement to severely limit the roundabout to avoid diversity between a logical line length and an actual line length, to implement the routing in the order from the nets in the clock signal to the nets in the general signal system, and to ease the roundabout limitation if there remains unrouted part by any means, and is a routing processing procedure meeting these requirements as well.

An example of designation in FIG. 12 represents a routing requirement where the designation is made in the order of the routed place information (where), the routing condition information (How) and the routed object information (Who) and the routed place information (Where) is given top priority. This example is a design requirement where the surface layer is used in preference to and the inner layer is used for only unrouted section, and is a routing processing procedure meeting this requirement as well.

As a combination in the routing processing procedures, the routing order information is added to the routed place information (Where), the routing condition information (How) and the routed object information (Who). Further, if OR condition and AND condition are set to each item (for example, 15 types in Who, as mentioned above), the number of the combinations is infinite.

Figure 13:
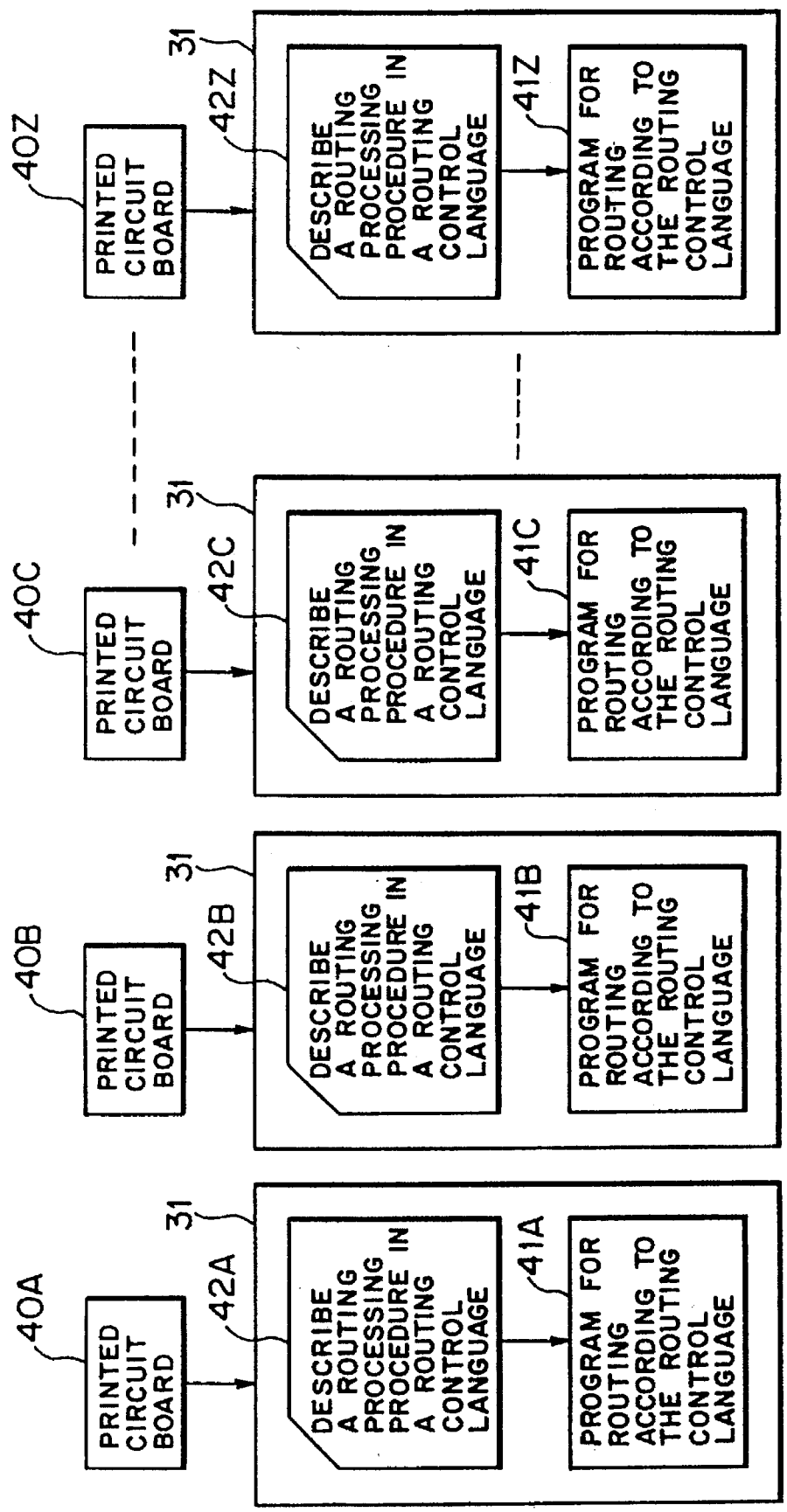
FIG. 13 is an illustration of an operation to generate a routing program according to the first embodiment.

In contrast to the general automatic routing technique in which the routing is carried out in only a few fixed procedures out of those infinite number of combinations, this embodiment allows a flexible combination in the routing processing procedure according to various kinds of routing design data by designating 3W1H by the designating unit 35, thus an automatic routing program most suitable for each design requirement (see reference numerals 41A-41Z in FIG. 13).

After implementation of the component placement at Step S12, the designation of rough routes (blocking) at Step S13 and the selection of the routing approach at Step S15 while verifying that each of various parameters is within a torelable range of the design evaluation of its own at Step S14, as above described, routing parameters (line length, type of the line, etc.) are set according to the design requirement specification (routing design data) (Step S16 in FIG. 8), and results stored in the above floorplan are composed as a routing processing procedure (algorithm) (Step S17 in FIG. 8). Thereafter, the procedure proceeds to a following routing design phase.

In the routing program generating apparatus 31 according to this embodiment, a routing approach is selected in a conversational mode in the course to proceed the floor plan according to the above-described procedure up to Step 17 shown in FIG. 8, while evaluating each routing efficiency. For instance, a routing processing procedure (algorithm) 42A-42Z described in a routing control language is composed for each of various printed circuits 41A-40Z to generate an automatic routing program 41A-41Z corresponding to each of various routing problems for executing the routing according to the routing processing procedure 42A-42Z, as shown in FIG. 13.

In FIG. 13, the printed circuit boards 40A-41Z have routing design data different to each other (problems based on design information of different systems incompatible with each other).

In the routing program generating apparatus 31, there is a phase to describe the routing processing procedure 42A-42Z in a routing control language for each of the various printed circuit boards 40A-40Z (see Steps S11-S17 in FIG. 8) and a phase to generate an automatic routing program 41A-41Z according to the routing processing procedure 42A-42Z described in its routing control language and to execute automatic routing (Steps S18-S21 in FIG. 8), as shown in FIG. 13.

Figure 14:
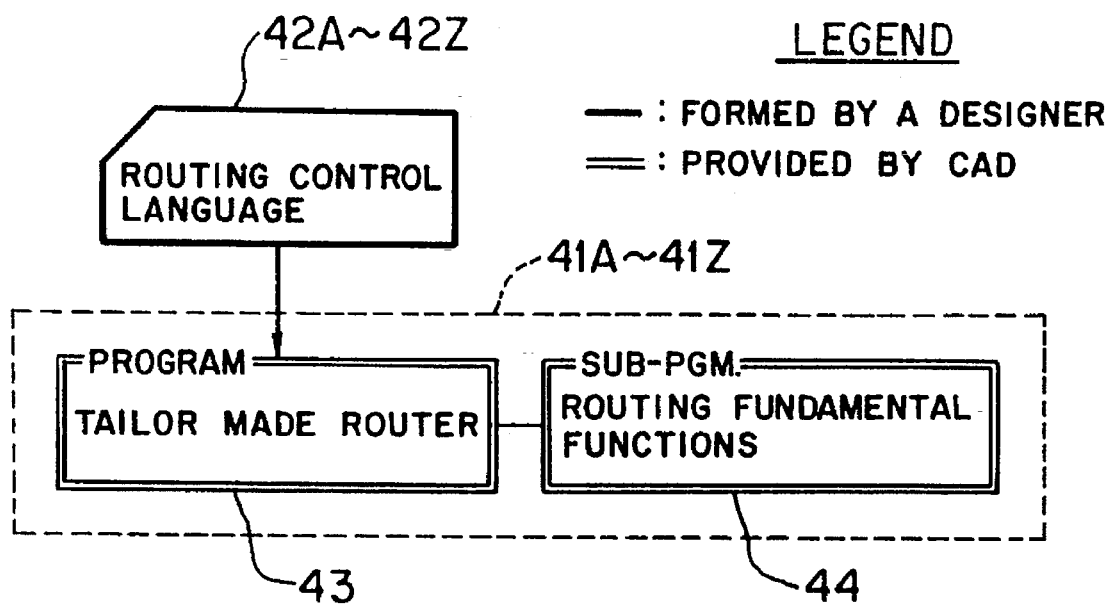
FIG. 14 is a block diagram of a means for generating an automatic routing program in an execute form according to the first embodiment.

According to this embodiment, each of the routing processing procedures 42A-42Z expressed in the routing control language automatically generated in the process of the floorplan is given to a tailor made router 43 (a certain program) so that an automatic routing program 41A-41Z most suitable for individual design requirement may be generated by reading out and referring to routing fundamental functions stored in a subprogram 44 (storage unit 36) to execute automatic routing, as shown in FIGS. 14 and 15.

The above-mentioned tailor made router 43 functionally has, as shown in FIG. 15, a language interpreting unit 45, a routing control, executing unit 46, a data setting unit 47, a routing fundamental function reading unit 48, a routing executing unit 49 and a data writing unit 50.

The language interpreting unit 45 interprets (complies) the routing control language expressing each of the routing processing procedures 42A-42Z to form repetitive data of the smallest units of the routed object information (Who), the routed place information (Where) and the routing condition information (How).

The routing control executing unit 46 executes the control based on the repetitive data from the language interpreting unit 45 with DO statement from one to the maximum value (max).

The data setting unit 47 is activated by the routing control executing unit 46 to set successively the repetitive data.

The routing fundamental function reading unit 48 selects routing fundamental functions corresponding to the repetitive data successively set by the data setting unit 47 from the sub program 44 to read them out.

The routing executing unit 49 executes automatic routing on the basis of the routing fundamental functions read out by the routing fundamental function reading unit 48.

The data writing unit 50 writes data having been executed by the routing control executing unit 46 into a routing database (not shown).

Tailor made router 43 with the above configuration generates the automatic routing program 41A-41Z in an execute form (Step S20 in FIG. 8), while the language interpreting unit 45 interprets the routing control language expressing each of the routing processing procedures 42A-42Z (Step S19 in FIG. 8), and the routing control executing unit 46, the data setting unit 47, the routing fundamental function reading unit 48 and the routing executing unit 49 execute automatic routing in accordance with interpreted designation (Step S21 in FIG. 8).

The tailor made router 43 above-mentioned may comply with different types of printed circuit boards 40A-40Z to be routed by using the same program. According to this embodiment, what needs to be formed for each printed circuit boards 40A-40Z is only the routing processing procedure 42A-42Z described in the routing control language.

In the general automatic routing technique, the procedure directly goes from the component placement at Step S12 to the routing execution at step S21 when the process steps from a stage of the package design into a stage of the routing design, as indicated by a chain double-dashed line L1 in FIG. 8. This means that the automatic routing design is implemented without a guarantee for the routing efficiency (floorplan). According to this embodiment, the routing control language is expressed and stored on the basis of information that the guarantee for the routing efficiency is assured as described at Steps S12 through S17 in FIG. 8, and the automatic routing is thereby executed. As a result, it is possible to obtain a result of the routing suitable for the design requirement specification (routing design data, routing problem).

As above, the routing program generating method and apparatus according to the first embodiment of this invention allows generation of the individual (exclusive) automatic routing programs 41A–41Z each customized and describing a routing processing procedure complying with each of various routing problems of the printed circuit boards 40A–40Z, whereby automatic routing may be carried out on the basis of each automatic routing programs 41A–41Z. This makes it possible to find out an optimum solution in automatic routing, with certainty and at a high-speed, even under severe design conditions so set as to meet requirements of high-density mounting and low cost, to improve largely the routing efficient, and to further contribute an improvement in performance of an electronic computer.

According to this embodiment, the routing designer does not form the routing control language (routing processing procedure) directly, but when an evaluation is made on the component placement in floorplanning (package design) the routing processing procedure 42A–42Z described in the routing control language is automatically generated (as a result). In consequence, it is possible to compose the routing processing procedure 42A–42Z simultaneously with completion of the floorplan without paid any attention by the routing designer, and to generate the automatic routing program 41A–41Z exclusive to and customized for each of various routing problems within an extremely short period of time, only by inputting the routing processing procedure 42A–42Z into the tailor made router 43.

Further, the routing approach is prepared in advance as plural kinds of routing fundamental functions in the storage unit 36 so that the customized, exclusive automatic routing program 41A–41Z may be easily and advantageously generated only by selecting and combining the routing fundamental functions depending on individual component placement or design requirement specification.

Still further, when the selecting unit 34 selects the routing approach, the designating unit 35 designates the routing control language [routed object information (Who), routed place information (Where), routing condition information (How), routing order information (When)] to designate a routing processing procedure. This makes it possible to adyantageously generate an optimum automatic routing program 41A–41Z for a region that is particularly difficult to be routed and in which automatic routing is difficult only by selecting and combining the routing fundamental functions.

(C) Description of Modifications of the Routing Program Generating Method According to the First Embodiment In the above first embodiment, there is used the routing control language stored during the floorplanning, as it is, as the routing processing procedure (algorithm) 42A–42Z, and the language interpreting unit 45 in the tailor made router 43 interprets it each time to form the automatic routing program 41A–41Z in an execute form, as described in connection with FIGS. 14 and 15. It is also possible in the routing program generating apparatus 31 according to this embodiment to form the automatic routing program 41A–41Z in an execute form on the basis of the routing control language stored during the floorplanning by means as described below shown in FIGS. 16 through 19.

Figure 16:
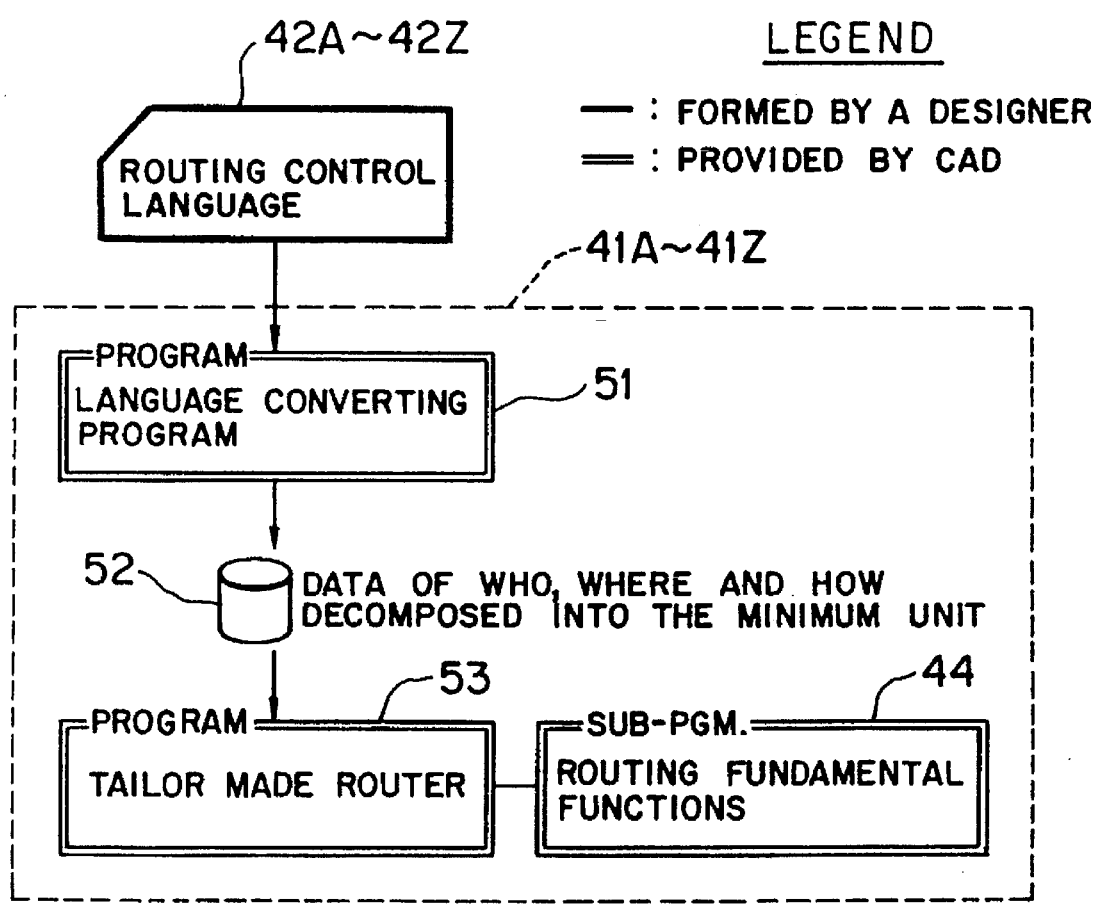
FIG. 16 is a block diagram of a modification of the means for generating an automatic routing program in an execute form according to the first embodiment.
Figure 17:
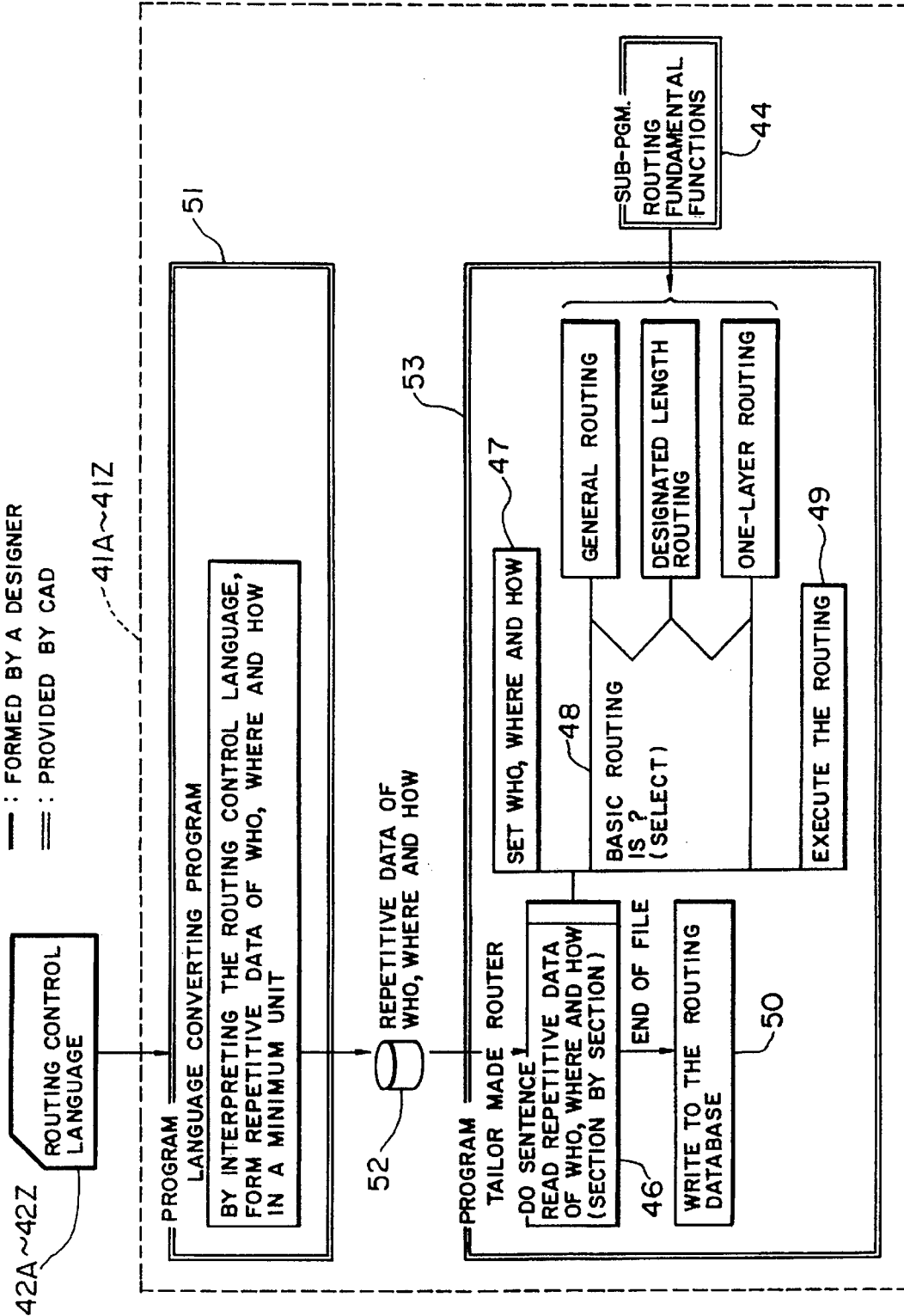
FIG. 17 is a detailed block diagram of the modification of the means for generating an automatic routing program in an execute form according to the first embodiment.

For example, in an example shown in FIGS. 16 and 17, a language conversion program 51 interprets, in advance, the routing processing procedure 42A–42Z described in the control language to convert it into a list of routing instructions to route two points (information including coordinates of the two points and routing conditions), that is, repetitive data (routing command sequence) of the smallest unit of the routing object information (Who), the routed place information (Where) and the routing condition information (How) so that the automatic routing program 41A–41Z executes routing between the two points as instructed.

In FIGS. 16 and 17, reference numeral 52 denotes a storage unit storing the repetitive data converted by the language conversion program 51, and 53 denotes a tailor made router (a certain program) actually executing automatic routing on the basis of the repetitive data stored in the storage unit 52.

Functionally, the tailor made router 53 has, as shown in FIG. 17, a routing control executing unit 46, a data setting unit 47, a routing fundamental function reading unit 48, a routing executing unit 49 and a data writing unit 50 as substantially the same as those in FIG. 15, wherein the routing fundamental functions stored in the sub program 44 (storage unit 36) are read out and referred to on the basis of the repetitive data (routing command sequence) in the storage unit 52, thereby generating an automatic routing program 41A–41Z most suitable for individual design requirements to execute automatic routing.

In other words, in the example shown in FIGS. 16 and 17, the language conversion program 51 interprets the routing control language expressing the routing processing procedure 42A–42Z to convert it into routing command sequences, whereby the tailor made router 53 may generate the automatic routing program 41A–41Z in an execute form directly from the routing command sequences.

The tailor made router 53 does not need the language interpreting unit 45 as provided in the tailor made router 43 shown in FIG. 15, but is able to cope with it with use of one extremely simple program merely executing automatic routing according to a routing instruction for each one section. In the example shown in FIGS. 16 and 17, what is need to be formed for each printed circuit board 40A–40Z is only the routing processing procedure 42A–42Z described in the routing control language.

Figure 18:
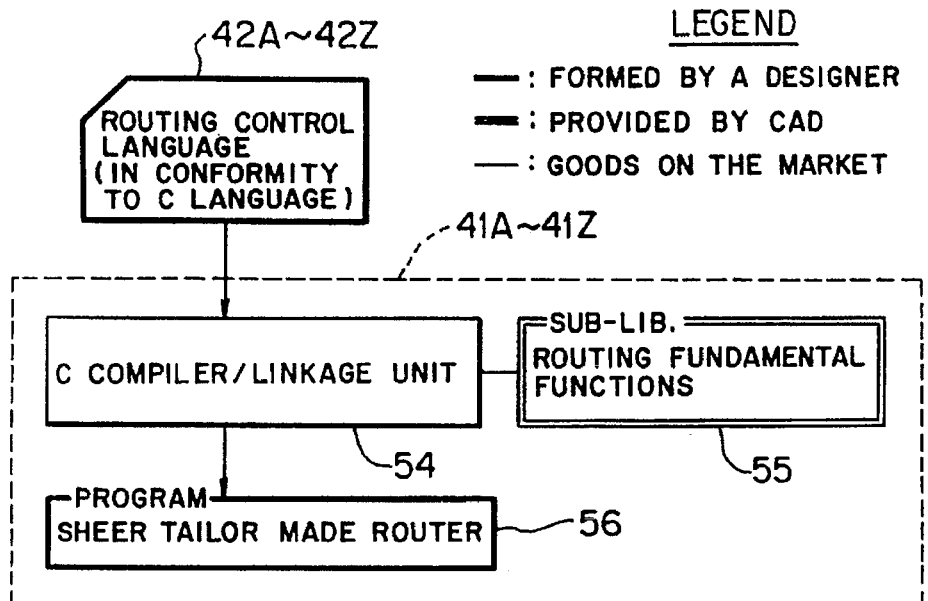
FIG. 18 is a block diagram of another modification of the means for generating the automatic routing program in an execute form according to the first embodiment.

In an example shown in FIG. 18, the routing processing procedure 42A–42Z is described in a routing control language such as C language according to a standard language specification in the field of art to form an automatic touring program 41A–41Z.

More specifically, in FIG. 18, the automatic routing program 41A–41Z executes automatic routing according to the routing processing procedure 42A–42Z described in the standard language in the field of art such as C language, including a C compiler/linkage unit 54 which interprets data described in the standard language in the field of art such as C language to link them with routing fundamental functions in a sub-library 55. Through the C compiler/linkage unit 54, a sheer tailor made router 56 existing in each routing control language becomes available.

In the example shown in FIG. 18, if the printed circuit boards 40A–40Z to be routed are of different types, the C compiler/linkage unit 54 and the sub-library 55 are the same. What is need to be formed for each printed circuit boards 40A–40Z is only the routing processing procedure 42A–42Z described in C language, and the tailor made router 56 is thereby automatically generated.

Figure 19:
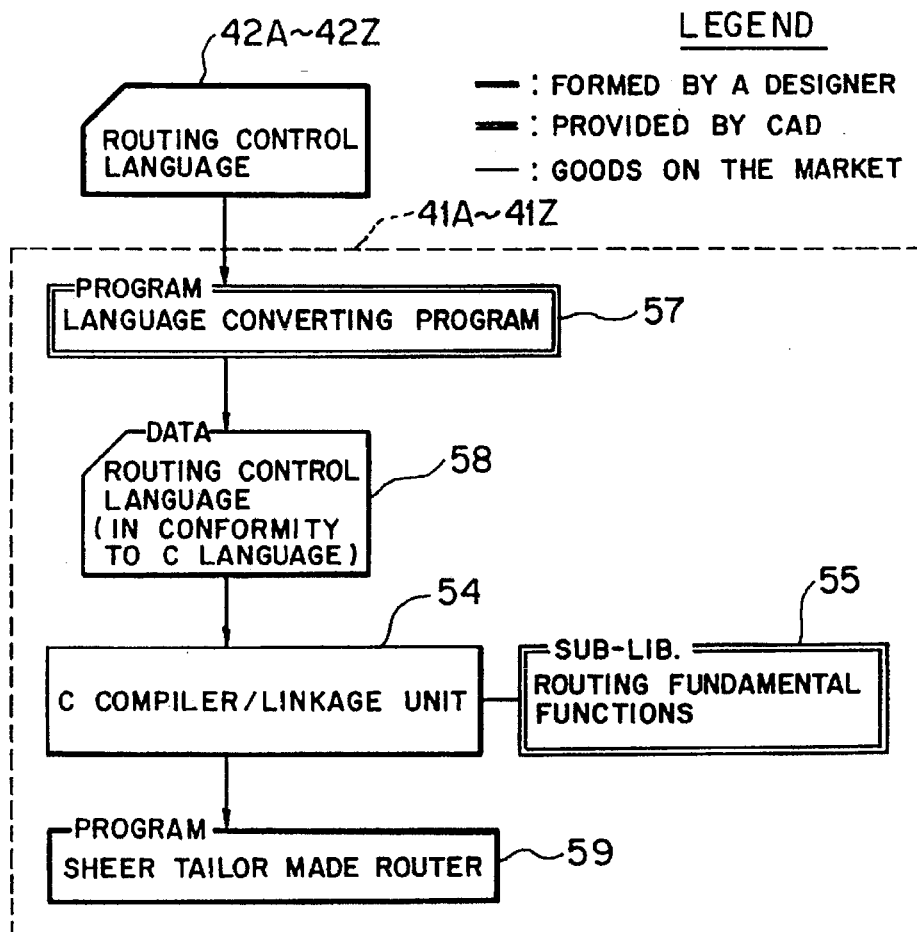
FIG. 19 is a block diagram of still another modification of the means for generating an automatic routing program in an execute form according to the first embodiment.

In an example shown in FIG. 19, a language conversion program 57 interprets in advance the routing control language describing the routing processing procedure 42A-42Z, automatically converts it into the standard language specification in the field of art such as C language so as to form the automatic routing program 41A-41Z on the basis of its source code.

More specifically, the automatic routing program 41A-41Z in FIG. 19 has a language conversion program 57 which automatically converts the routing control language describing the routing processing procedure 42A-42Z into a standard language specification in the field of art such as C language, and executes automatic routing according to a routing processing procedure 58 described in the routing control language in conformity with C language or the like obtained by, the language conversion program 57.

There are also provided a C compiler/linkage 54 and a sub-library 55 similar to those shown in FIG. 18 to effectively accomplish a sheer tailor made router 59 existing in each routing control language through the C compiler/linkage unit 54.

In the example shown in FIG. 19, if the printed circuit boards 40A-40Z to be routed are of difference types, the language conversion program 57, the C compiler/linkage unit 54 and the sub-library 55 are the same. What is need to be formed for each printed circuit board 40A-40Z is only a routing processing procedure 42A-42Z described in C language, and the tailor made router 59 may thereby be automatically generated.

Having been described four types of procedures to form the automatic routing program 41A-41Z in an execute form from the routing control procedure 42A-42Z described in the routing control language referring to FIGS. 14 through 19, fundamental processing procedures of each of the means are collectively shown in FIGS. 20(A) through 20(D) for the sake of illustration.

Figure 20:
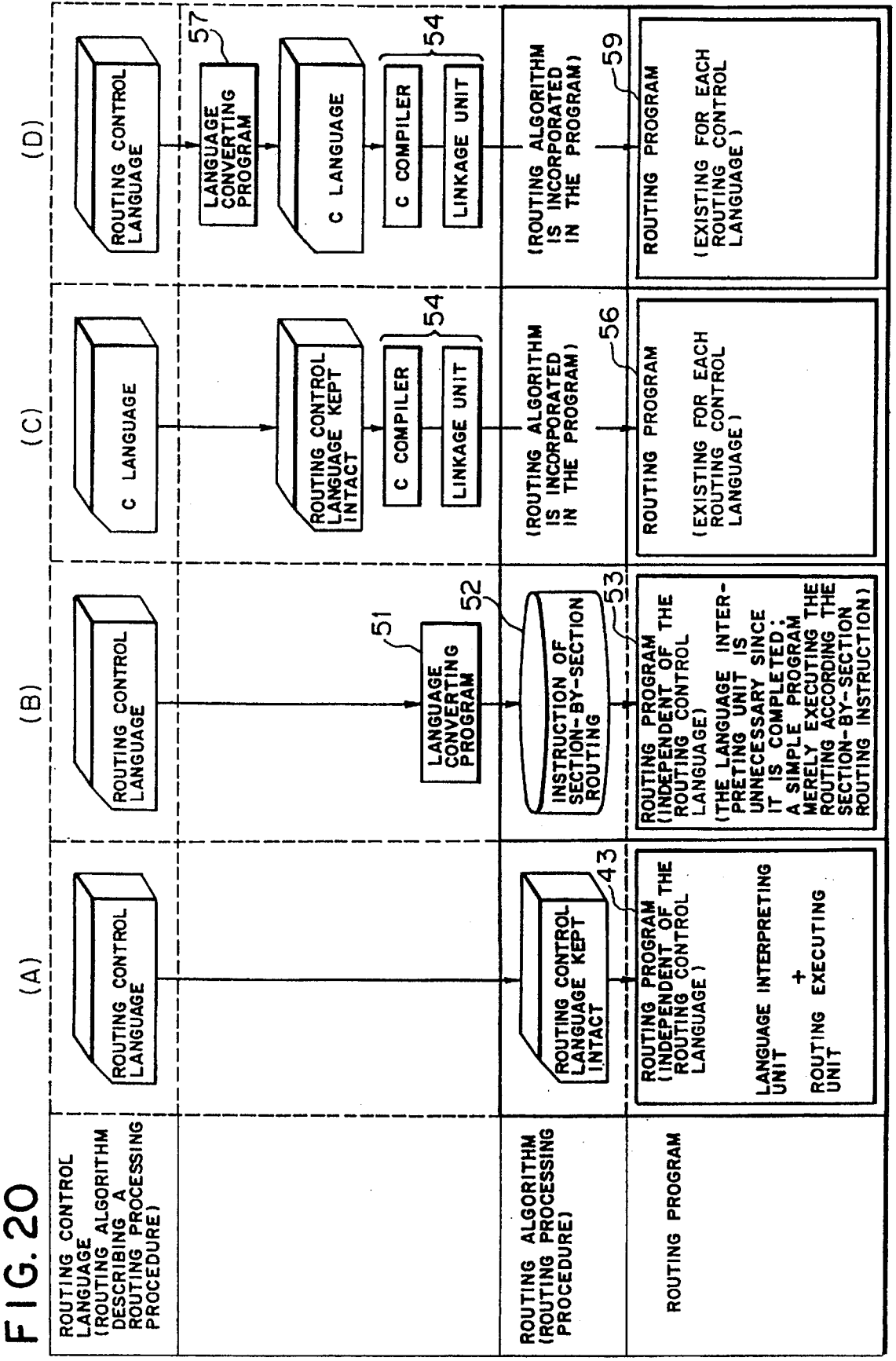
FIG. 20 is an illustration showing basic processing procedures of the means of four types for generating an automatic Pouting program in an execute form according to the first embodiment so as to clarify differences of the means.

FIG. 20(A) corresponds to the means shown in FIGS. 14 and 15, 20(B) to the means shown in FIGS. 16 and 17, and FIGS. 20(C) and 20(D) to the means shown in FIGS. 18 and 19, respectively. In FIGS,. 20(A) through 20(D), like reference characters designate the corresponding parts above mentioned in FIGS. 14 through 19, detailed descriptions of which are skipped.

As having been made the description of the method and apparatus of this invention for automatic routing on printed circuit boards, it should be noted that this invention is not limited to the above example. This invention is also applicable to routing design on semiconductor integrated circuits, for example, LSI and the like. In which case, it is a matter of course that this invention may provide the same advantages and effects as the above embodiment.

Figures 21, 22:
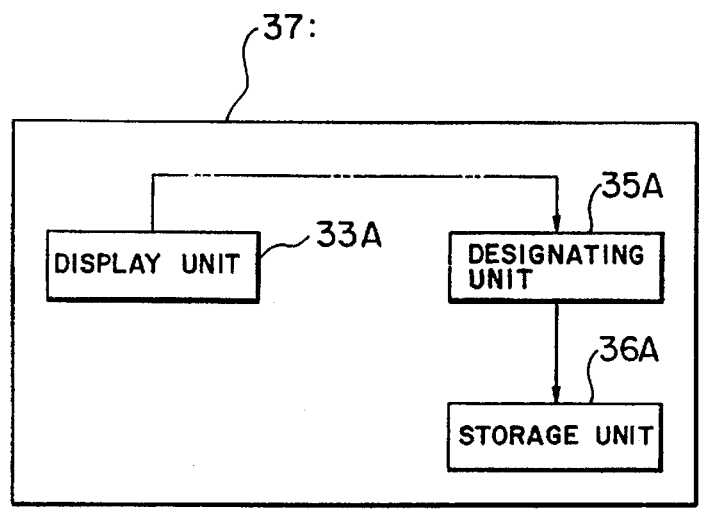
FIG. 21 is a block diagram of a placement program generating apparatus according to the first embodiment of this invention.
FIG. 22 is an illustration of an example to designate placed component grouping information, placed region designating information and placing condition information in that order in the first embodiment.

(D) Description of a Routing Program Generating Method According to the First Embodiment According to the first embodiment, an automatic placement program (see reference numerals 39A-39Z in FIG. 25) generated by, for example, a placement program generating apparatus 37 shown in FIG. 21 is used upon initial placement of components carried out at Step S12 in FIG. 8 to implement component placement on a printed circuit board (see reference numerals 40A-40Z in FIGS. 13 and 25) that is an object of the component placement.

FIG. 21 is a block diagram of a placement program generating apparatus according to the first embodiment of this invention. The placement program generating apparatus 37 shown in FIG. 21 serves to compose a placement processing procedure (algorithm) on the basis of predetermined design data (placement problem) to generate an automatic placement program, including a display unit 33A, a designating unit 35A and a storage unit 36A.

The display unit 33A displays various information such as progress of generation of an automatic placement program and the like. The designating unit 35A designates a component routing processing procedure by designating placed component grouping information, placed region designating information, placing condition information and group placing order information, etc. This various information is stored in the storage unit 36A. The information is read out from the storage unit 36A when designated by the designating unit 35A.

Upon initial placement of the components carried out at Step S12 in FIG. 8 as above described, the designer (operator) designates the placed component grouping information, the placed region designating information, the placing condition information, the group placement order information, etc. as placement control information through the designating unit 35A to compose the component placement processing procedure, thereby generating the automatic placement program in the placement program generating apparatus 37 of this embodiment.

The above placement program generating apparatus 37 may be realized with a general personal computer or the like as same as the routing program generating apparatus 31 of this embodiment described above in connection with FIG. 7. The placement program generating apparatus 37 may be configured separately from the routing program generating apparatus 31, or may serve both as the routing program generating apparatus 31 and the placement program generating apparatus 37.

The general automatic placement technique arranges (programs) items of given placement information, that is, (1) grouping (placed component grouping information), (2) designation of placed region (placed region designating information) (3) in which order the groups are placed (group placing order information) and (4) under which condition the groups are placed (placing condition information), on the ground of the routing know-how in the past. There are, however, some cases where the above fixed procedure fails to yield an optimum result for particular printed circuit boards.

This embodiment makes it possible to readily alter the routing by designating the above information of (1) through (4) by the designating unit 35A, thereby enabling a recombination most suitable for the property of each printed circuit (see reference numerals 40A-40Z in FIGS. 13 and 25). More specifically, in the general automatic routing technique, only the above information of (1) through (4) are incorporated, but its contents are only items independent of the contents of individual design data. This embodiment makes it possible to designate and alter the information depending on the contents of individual design data with the above information of (1) through (4) to obtain easily an optimum result in the placement.

Practical contents (items) of the above information of (1) through (4) designated by the designating unit 35A are as follows:

(a) designating items of placed component grouping information:

names of particular components;
circuit symbols;

types of components;

shapes of components;

specified power-source net;

page of circuit diagram designation of specified block in circuit diagram;

(b) designating items of placed region designating information:

placement permitted region;

placement inhibited region;

on the upper surface or the bottom surface of a substrate ?;

(c) group placement order information:.

designation of the order of the groups designated in the above-mentioned placed component grouping information;

(d) designating items of placement condition information:

sizes of the shapes of components;

sizes of pins;

the order of preference between the upper surface and the bottom surface;

quantity of power-consumption;

right or wrong on placement of aligned components;

right or wrong on equal spacing placement;

the number of connections with components placed earlier;

displaying optimum placing positions, and leaving the results to the designer (navigation placement)

In this embodiment, it is possible to designate the above items by the designating unit 35A solely. It is alternatively possible to set OR condition or AND condition to a plurality of items. It is therefore possible to designate a component placement processing procedure most suitable for individual design conditions.

There is no particular restriction on an arrangement of the placed component grouping information, the placed region designating information and the placing condition information designated by the designating unit 35A in this embodiment. It is possible to designate an optimum component placement processing procedure most suitable for individual design information.

By designating the above various items of (a) through (d), the following optimum placement approaches of (1) through (19) become possible:

(1) optimum placement approach for particular components;

(2) optimum placement approach by grouping the components to be placed;

(3) optimum placement approach by grouping certain components to be connected with another certain components;

(4) optimum placement approach by grouping according to the types of components;

(5) optimum placement approach by grouping according to a specified power-source net;

(6) optimum placement approach by grouping according to circuit symbols of components;

(7) optimum placement approach by grouping according to the shapes of components;

(8) optimum placement approach by grouping components belonging to a particular page of the circuit diagram;

(9) optimum placement approach by grouping components belonging to a particular block of circuit diagram;

(10) optimum placement approach by directing a surface of the printed circuit board on which the group designated in the above (2) through (9) is to be mounted when designating a placed position for that group;

(11) optimum placement approach by directing a mounted region on the printed circuit board on which the group designated in the above (2) through (9) is to be mounted when designating a placed position of that group; (12) optimum placement approach placing the group designated in the above (2) through (9) according to size of components;

(13) optimum placement approach placing the group designated in the above (2) through (9) according to size of the connections;

(14) optimum placement approach placing the group designated in the above (2) through (9) in an arbitrary order;

(15) optimum placement approach placing the group designated in the above (2) through (9) or components in that group according to a quantity of power consumption;

(16) optimum placement approach placing the group designated in the above (2) through (9) according to the number of connections with components of the group placed earlier;

(17) optimum placement approach placing the groups designated in the above (2) through (9) in alignment;

(18) optimum placement approach placing the groups designated in the above (2) through (9) at an equal spacing;

(19) optimum placement approach in which the system (the placement program generating apparatus 37) recommends the optimum placement designated in the above (1) through (18);

FIGS. 22 through 24 show practical examples to designate the placed component grouping information (components to be grouped), the placed region designating information (in which region), and the placing condition information (placing conditions). It is noted that the group placing order information is designated as the order of appearing the net groups designated by the placed component grouping information.

An example of designation in FIG. 22 is a demand for placement to give top priority to the grouping as designating the placed component grouping information, the placed region designating information, and the placement condition information in that order. This example is a demand in design attaching an importance to complete the placement of connectors prior to general components. This is also a demand to place the connectors on the upper surface on the printed circuit board (substrate) in the order from the larger sized, then to place the connectors on the bottom surface of the printed circuit board (substrate) in the order from the larger sized, and is a placement processing procedure therefore as well.

FIG. 23 shows an example where the placing condition information, the placed component grouping information and the placed region designating information are designated in that order, which is a demand for placement to give top priority to the placing condition. This example is a demand in design to complete the placement of the connectors, prior to the general components, on the upper surface of a printed circuit board (substrate) in the order from the one having the larger number of pins, then on the bottom surface of the same in the same order, and to place components having the power-source net within a placed region on the upper surface of the printed circuit board (substrate), and is a placement processing procedure therefore as well.

Another example shown in FIG. 24 is a demand for placement to give top priority to a placed region as designating the placed region designating information, the placed components grouping information and the placing condition information in that order. This example is a demand in design to complete the placement of connectors on the upper surface of a printed circuit board (substrate) in the order from the one having the larger number of pins prior to the general components, to place, secondary, capacitors in the order from the one having the larger number of pins, and to place, third, components having a power-source net in the order from the one having larger outer dimensions, and is a placement processing procedure therefore, as well.

The group placing order information is added to the placed component grouping information, the placed region designating information and the placing condition information as a combination of the placement processing procedures. If added OR condition and AND condition to each of the items, a number of directions become feasible.

The general automatic placement technique employs a few fixed procedures out of a number of these combinations to execute automatic placement. According to this embodiment, it is possible to designate extremely flexibly the placed component grouping information, the placed region designating information, the placing condition information and the group placing order information by the designating unit 35A so as to provide an automatic placement program (see reference numerals 39A–39Z in FIG. 25) most suitable for each design demand.

In the placement program generating apparatus 37 of this embodiment, on an initial placement of components at Step S12 in FIG. 8, a component placement processing procedure described according to placement control information are, for example, composed for each of various printed circuit boards 40A–40Z to generate an automatic placement program 39A–39Z complying with each of various placement problems to execute the placement according to the component placement processing procedure 38A–38Z, as shown in FIG. 25.

In FIG. 25, printed circuit boards 40A–40Z have placement design data different to each other (placement problems based on design information for printed circuit boards for different systems incompatible with each other).

The placement program generating apparatus 37 has, as shown in FIG. 25, a phase to designate the component placement processing procedure 38A–38Z with use of placement control information and to describe it, and a phase to generate the automatic placement program 39A–39Z according to the component placement processing procedure described with the placement control information to execute automatic placement.

As above, the placement program generating method and apparatus therefore according to the first embodiment of this invention allows easy generation of customized, individual (exclusive) automatic placement program 39A–39Z describing the component placement processing procedure complying with a placement problem of each of various printed circuit boards 40A–40Z to enable an optimum placement according to each of the automatic placement program 39A–39Z. This feature is helpful to find out an optimum solution for the problem even under server design conditions set to meet demands such as high-density mounting and low-cost without relying on human labour, and to contribute an improvement in performance of an electronic computer.

This embodiment may advantageously generate the automatic routing program 39A–39Z most suitable for each object to be placed thereon at any time by designating the routing control language (the placed component grouping information, the placed region designating information, the placing condition information and the group placing order information) to designate the component placement processing procedure.

(E) Description of Second Embodiment

Figure 26:
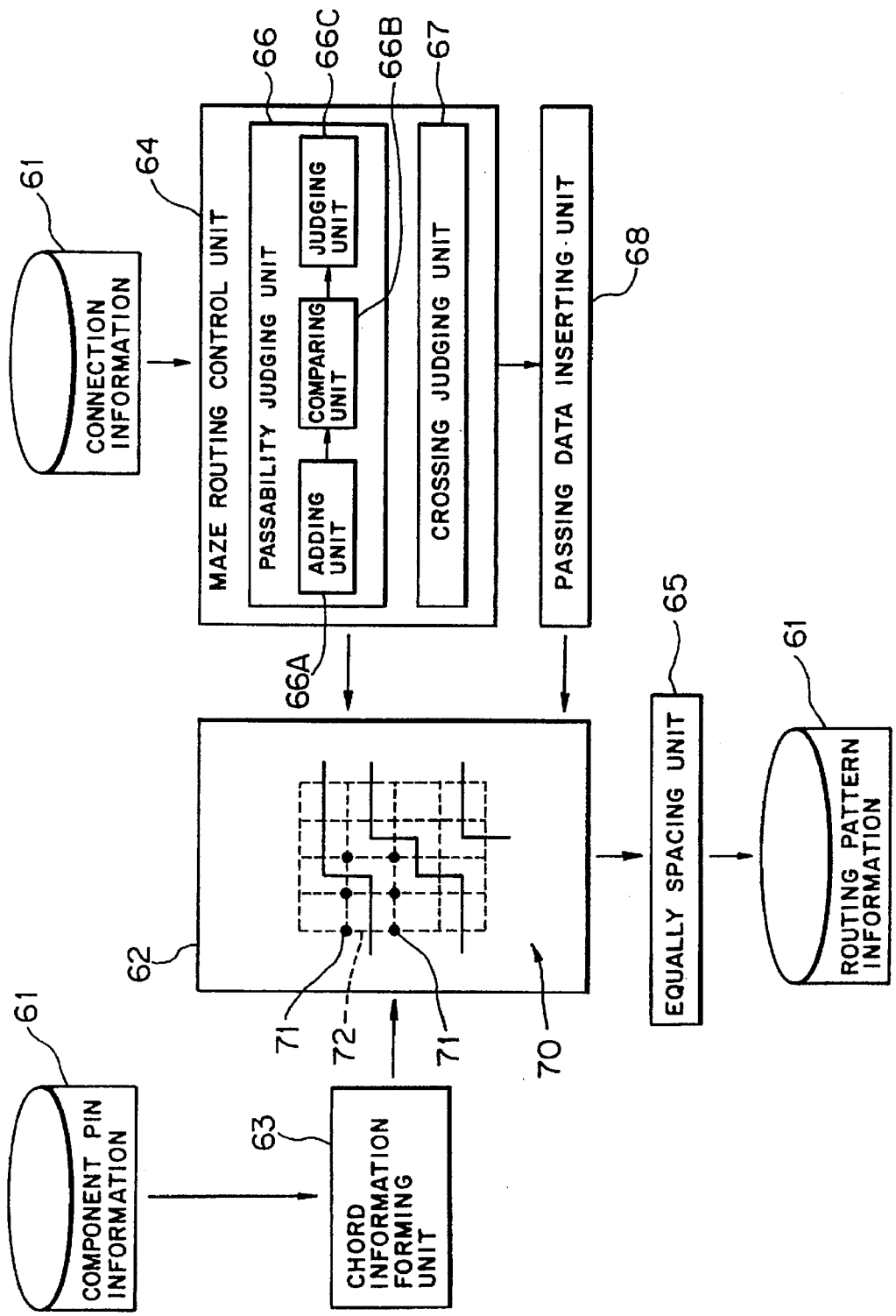
FIG. 26 is a block diagram of an automatic routing apparatus according to a second embodiment of this invention.

FIG. 26 is a block diagram of an automatic routing apparatus according to a second embodiment of this invention.

Now referring to FIG. 27, there is shown a printed circuit board 70 to be routed thereon according to this embodiment. The printed circuit board in FIG. 27 has a number of component pins 71 (71A,71B). Here assuming that a routing path is determined in order to route automatically a routing pattern between a start point (component pin) 71A and an end point (component pin) 71B.

As shown in FIG. 26, the automatic routing apparatus 60 of this embodiment is to determine a routing path in order to route automatically a routing pattern on the printed circuit board 70 having a number of component pins 71 (71A,71B) shown in FIG. 27. The automatic routing apparatus 60 has a database 61, routing database 62, a chord information forming unit 63, a maze routing control unit 64, an equally spacing unit 65, a passability judging unit 66, a crossing judging unit 67 and a passing data inserting unit 68.

The database 61 stores various connection information on the printed circuit board 70 necessary for automatic routing, component pin information or routing pattern information as a result of automatic routing executed by the automatic routing apparatus 60.

The routing database 62 stores various information about the printed circuit board that is an object of the automatic routing (passing information of a routing patter, positional information of chords 72 described later, etc.) during an automatic routing process according to this embodiment.

The chord information forming unit 63 reads component pin information from the database 61 to form positional information about a chord 72 (basic data for retaining the passing information of the routing pattern) that is a straight line connecting two adjacent component pins 71 (71A,71B) as shown in FIG. 27, and writes it into the routing database 62.

The maze routing control unit 64 generates a wave for maze method routing towards the end point 71B from the start point 71A of the routing path, propagates the wave between two adjacent chords 72 on the basis of information about the chord 14 formed by the chord information forming unit 63, successively stores positions of chords 72, through which the wave has passed until reaching the end point 71B from the start point 71A. When the wave reaches the end point 71B, the maze routing control unit 64 traces (backtracing) the positions of the chords 72, through which the wave has passed, back to the start point 71A from the end point 71B to determine a routing path of the routing pattern.

More specifically, the maze routing control unit 64 of this embodiment generates a wave from the start point 71A toward the end point 71B on the printed circuit board 70 assumed by the routing database 62, as shown in FIG. 27.

This wave starts from the starting point 71A and reaches 71B as indicated by encircled numbers on the chords 72 as shown in FIG. 27, where the chord 72 closest to the start point 71A is labelled 1, a chord 72 adjacent to the chord 72 labelled 1 is labelled 2, a chord 72 adjacent to the chord 72 labelled 2 is labelled 3, and so on.

in the example shown in FIG. 27, the wave reaches the end point 71B next to the third chord 72 counted from the start point. The chords 72 that the wave has passed until reaching the end point 71B from the start point 71A are successively stored in the routing database 62. When the wave reaches the end point 71B, it is possible to determine a routing path 73 of the routing pattern by tracing the positions of the chords 72, through which the wave has passed, back to the start point 71A from the end point 71B.

In FIG. 26, the equally spacing unit 65 routes the routing pattern passing through the chord 72 at an equal space between the component pins (71A,71B), after the maze routing control unit 64 has decided the routing path of the routing pattern on the printed circuit board 70.

The passability judging unit 66 is provided in the maze routing control unit 64. When the maze routing control unit 64 propagates the wave between adjacent chords 72, the passability judging unit 66 judges as to whether the routing pattern is passable or not on the basis of a capacity between two component pins 71 (71A,71B) forming that chord 72.

The passability judging unit 66 of this embodiment is configured with an adding unit 66A, a comparing unit 66B and a judging unit 66C.

The adding unit 66A calculates a total sum of a line width of the routing pattern passing through the chord 72 in this wave propagation and line widths of the routing patterns having been permitted to pass through that chord 72 up to this wave propagation. The comparing unit 66B compares the total sum of the line widths calculated by the adding unit 66A with a distance between the component pins 71 (71A, 71B) (that is, a known data given by the database 61 as component pin information) forming that chord 72. The judging unit 66C permits the routing pattern to pass when the judging unit 66B concludes in the judgement that total sum is smaller than that distance.

When the passability judging unit 66 permits a plurality of routing patterns to pass through the chord 72, the routing database 62 of this embodiment stores a position on that chord 72, through which each of the routing patterns passes, as a relative position on that chord 72 (indicating where an intersection of a routing path of the routing pattern and the chord 72 lies on that chord 72).

The crossing judging unit 67 is provided in the maze routing control unit 64 to judge a crossing of the routing patterns on the basis of relative positions of respective routing patterns on adjacent chords 72 (retained in the routing database 62) when at least two routing patterns pass through the adjacent chords 72.

When the maze routing control unit 64 propagates a wave between adjacent chords 72, the passing data inserting unit 68 registers passing information of a routing pattern when that routing pattern passes through the chords 72. When the passability judging unit 66 permits a plurality of routing patterns to pass through the chord 72, the passing data inserting unit 68 shifts, if necessary, relative positions of the routing patterns on that chord 72 having already been permitted to pass while taking those relative positions of the routing patterns into consideration, and registers a relative position of a routing pattern on that chord 72 that passes last in the routing database 62 as new passing information of a new routing pattern.

An automatic routing method accomplished in the automatic routing apparatus 60 having the above configuration will be next described referring to FIGS. 28 through 32.

Figure 28A:
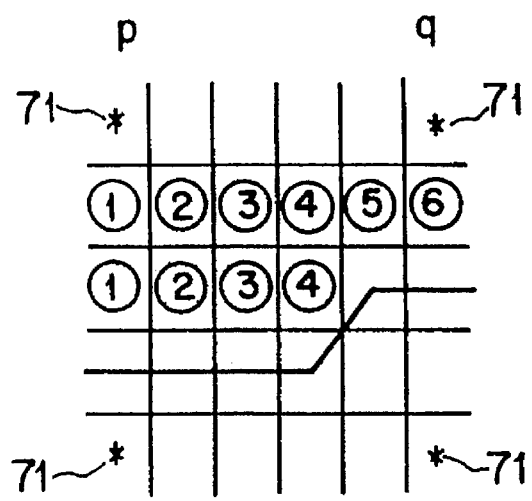
FIGS. 28(A) and 28(B) are illustrations showing the operation of the automatic routing apparatus according to the second embodiment.
Figure 28B:
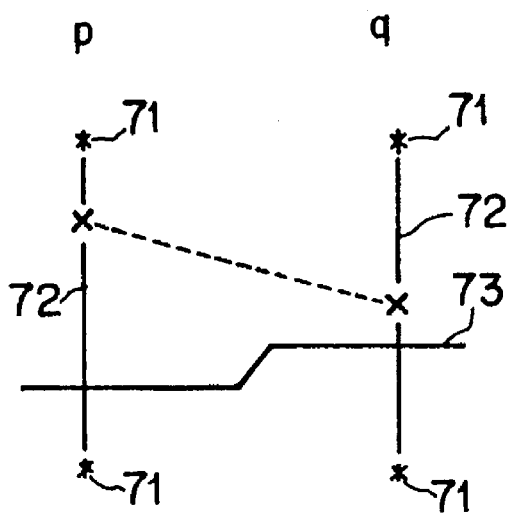

Assuming that a wave for maze routing is propagated from a point p to a point q as shown in FIGS. 28(A) and 28(B). If a mesh is set as shown in FIG. 28(A) in the maze method employing meshes described before in connection with FIG. 36, the wave needs to pass at least 6 meshes to reach the point q from the point p as shown in FIG. 28(A). If employing the maze routing control unit 64 of this embodiment, the wave can directly reach the point q on a chord 72 from the point p on another chord 72 as shown in FIG. 28(B).

According to this embodiment, it is possible to decide a routing path of a routing pattern within a short period of time without using meshes consisting of rectangles each depending on a width of the routing pattern since an object of the wave propagation is, not a mesh in a shape of a rectangle depending on a width of a routing pattern, but a chord 72 whose basic unit is a distance between two component pins 71 that is considerably longer than a width of a routing pattern.

Figure 29:
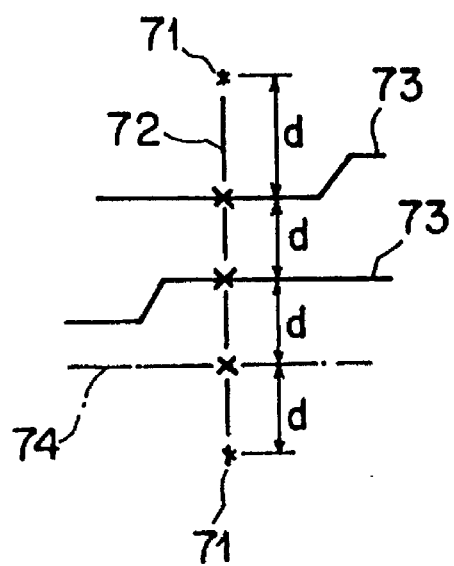
FIG. 29 is an illustration showing the operation of the automatic routing apparatus according to the second embodiment.

Incidentally, in FIGS. 28(B) and 29, x marks on the chords 72 are used to register passing of the wave through the chords 72 (intersections of the wave and the chords 72), and reference numeral 73 indicates a routing path that has been already permitted to pass through.

In the automatic routing apparatus 60 of this embodiment, after the maze routing control unit 64 has decided all routing paths of the routing patterns on the printed circuit board 70, the equally spacing unit 65 automatically routes the routing patterns passing through the chord 72 at equal spacings between the component pins 71. An absolute position of the finally decided routing pattern is registered in the database 61.

Figure 36:
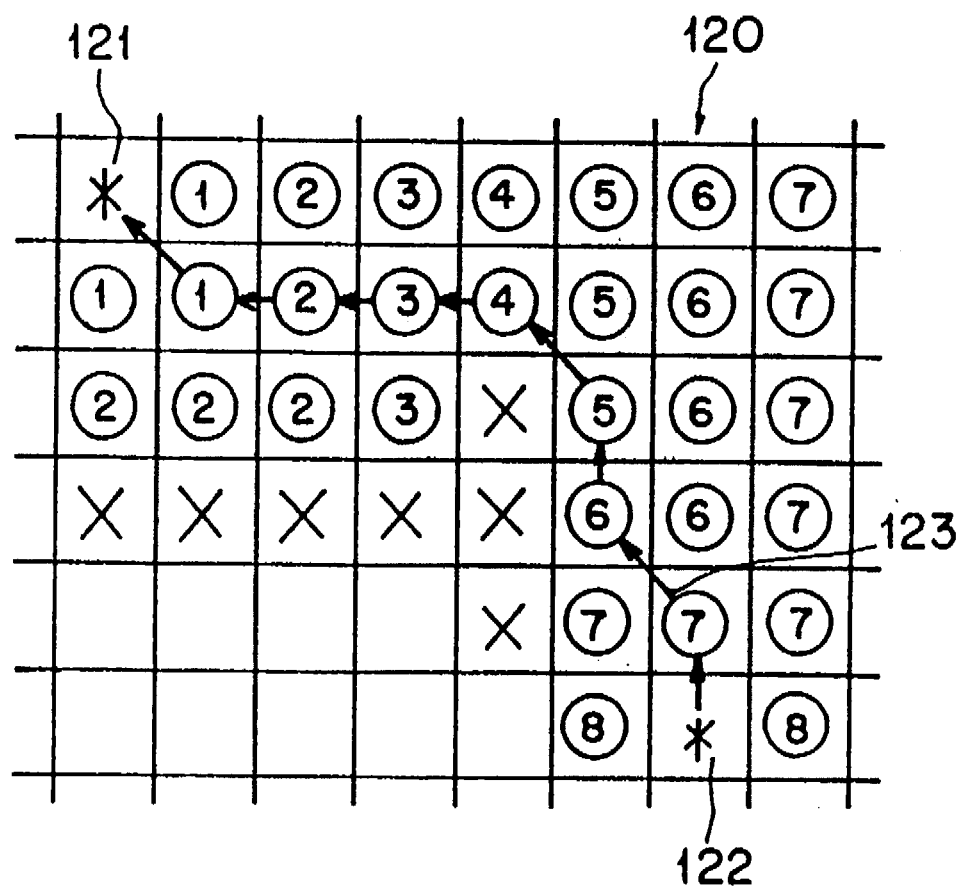
FIG. 36 is an illustration showing a general maze method employing meshes.

Assuming that routing patterns are intended to be allocated at equal spacings between the component pins in the above-mentioned maze method employing meshes shown in FIG. 36. As shown in FIG. 29, if a path of a new routing pattern is added in a state where two routing paths 73 through the chord 72 between the component pins 71 have been already decided, it is necessary to alter positions (coordinates) of the routing paths 73 so that distances among the three routing paths 73,74 between the component pins 71 are in equal when pass of the new routing path 74 is decided.

To the contrary, in the automatic routing apparatus 60 of this embodiment, the positions through which the two routing paths 73 pass as shown in FIG. 29 between the component pins 71 (on the chord 72) are merely registered as relative positions in the routing database 62 in a middle stage of the process by the maze routing control unit 64, as stated above.

At a time when a new routing path 74 is decided, the passing data inserting unit 68 settles a position through which the new routing path 74 passes in the lowest part on the chord 72 (between the lower routing path 73 and the lower component pin 71), and additionally registers the new routing path 74 in the routing database 62 as a relative position to those of the other two routing paths 73.

In other words, there is no need to rewrite the coordinates when the new routing path 74 is added between the component pins 71 (on the chord 72). It is sufficient that the equally spacing unit 64 so sets the coordinates that spacings d of the routing paths 73,74 between the component pins 71 are in equal in the final stage where all routing paths of the routing patterns on the printed circuit board 70 have been decided.

By equally spacing the routing patterns between the component pins 71, it is possible to minimize an electric effect of the component pins 71 on the routing patterns or a mutual electric effect on the routing patterns, or to improve an yielding rate of the routing patterns to minimize a cost for routing of the routing patterns on the printed circuit board 70.

Further, in the automatic routing apparatus 60 of this embodiment, the passability judging unit 66 judges passability of the routing pattern on the basis of a capacity between the component pins 71 forming the chord 72 when the maze routing control unit 64 propagates a wave between two adjacent chords 72 so that it is possible to prevent the unroutable number of routing patterns from passing between the component pins (on the chord 72), and to make a judgement as to the passability within a short period of time.

In the above-mentioned maze method employing meshes shown in FIG. 36, if a new routing path 74 is added to pass through the chord 72, a distance between the new routing path 74 and the lower component pin 71 is first calculated when a judgement is made as to whether the new routing pattern can pass between the component pins 71, as stated in connection with FIG. 29. If the distance is not sufficient to pass the new routing pattern, it is necessary to move upwardly the positions of the two routing paths 73 that have been routed, then to examine a distance between the new routing path and the component pin 71 once again. If the distance is judged to be not sufficient to pass the new routing path 74, an operation such as to put the two routing paths 73 that have been moved upwardly back to positions where they were. As this, the route search requires a considerable period of time.

According to the automatic routing apparatus 60 of this embodiment, the adding unit 66A in the passability judging unit 66 calculates a total sum of a line width of a routing pattern (a new routing path 74) passing through the chord 72 in this wave propagation and line widths of routing patterns (two routing paths 73) that have been permitted to pass through the chord 72 up to this wave propagation, the comparing unit 66B compares the total sum of the widths and a (known) distance between component pins 71, and the judging unit 66C examines whether an inequality [a distance between the component pins 71]>[a sum of line widths of the routing patterns 73,73] is satisfied or not, as stated above. Through only the above process, it is possible to judge passability of the new routing path 74 so as to prevent routing patterns having widths in excess of a distance between the component pins 71 (a length of the chord 72) from passing through. As a result, a search in routing path may be made within an extremely short period of time.

According to the maze method employing meshes shown in FIG. 36, if a new routing path 74 is intended to be added in a state where the two routing paths 73 through the chord 72 between the component pins 71 have been already decided, it is necessary to decide distances of the existing two routing paths from the upper component pin 71, taking line widths of the existing two routing patterns into consideration, as stated in connection with FIG. 29. However, a method of trial and error is, in general, used to search a routing path, so the new routing path 74 that is searched here is not always employed as it is. If the new routing path is not employed, it is necessary to put the existing routing paths back to their original positions.

According to this embodiment, the automatic routing apparatus 60 sets positions of the two routing paths 73 between the component pins 71 (on the chord 72) in the routing database 62 as merely relative positions, as stated above. If a new routing path 74 is employed, it is sufficient that the passing data inserting unit 68 registers a presence of the new routing path 74 between the lower routing path 73 and the lower component pin 71 as its relative position, and the equally spacing unit 65 calculate an actual position (an absolute position) of the new routing path only once in the final stage.

If the new routing path 74 is not employed, it is sufficient to express that the routing path is not present between the lower routing path 73 and the lower component pin 71. Therefore, no effect is exerted on positions of the existing routing paths 73, and a search for routing paths may be made within an extremely short period of time, as stated above.

The automatic routing apparatus 60 of this embodiment stores positions in which a plurality of routing patterns cross the chord 72 as relative positions in the routing database 62. If at least two routing paths 73,74 of routing patterns pass through adjacent chords 72,72 in positions of p and q, respectively, as shown in FIG. 30, the crossing judgement unit 67 of the maze routing control unit 64 readily judges crossing of the routing paths 73,74 on the basis of relative positions of the routing paths 73,74 on the two chords 72 in the positions of p and q, respectively, without carrying out any complex operations.

Figure 30:
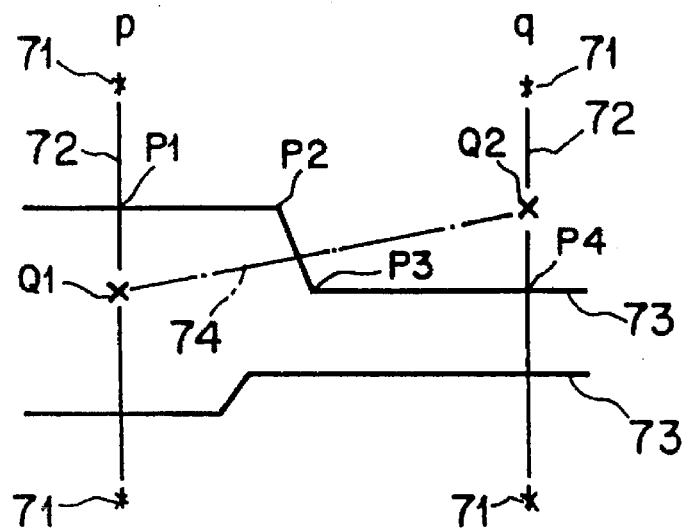
FIG. 30 is an illustration showing the operation of the automatic routing apparatus according to the second embodiment.

Assuming here that a new routing path 74 passing through positions Q1 and Q2 on the respective chords 72 in the positions p,q is intended to be added in a state where the routing paths 73 passing through the positions P1 and P4 on the chords 72 in the positions p,q have been already decided as shown in FIG. 30. According to the maze method employing meshes shown in FIG. 36, in order to examine whether the new routing path crosses the existing another routing pattern 73 or not, it is necessary to find out a routing pattern of the routing path 73 extending from P1 to P2, from P2 to P3, and from P3 to P4 among a number of routing patterns existing on the printed circuit board 70, to confirm continuity of the routing pattern, to judge that a line connecting the position Q1 and the position Q2 crosses the existing routing pattern 73, and to finally conclude that no routing path 74 reaching the position Q2 from the position Q1 does not exist between the positions p and q.

In the automatic routing apparatus 60 of this embodiment, the crossing judging unit 67 clearly judges whether the existing routing path 73 extending from the position P1 to the position P4 crosses the new routing path extending from the position Q1 to the position Q2 or not, from the following two points:

(1) on the chord 72 located at the position p, the position P1 exists above the position Q1; and (2) the existing routing path 73 continues up to the position P4 below the position Q2 on the chord 72 located in the position q.

As seen from FIG. 30, it is possible to judge immediately that the new routing path 74 needs to cross the existing routing path 73 extending from the position P1 to the position P4 in order to reach the position Q2 on the chord 72 in the position q from the position Q1 on the chord 72 in the position p. As this, it is possible to shorten a time period required to search routing paths.

Figure 35:
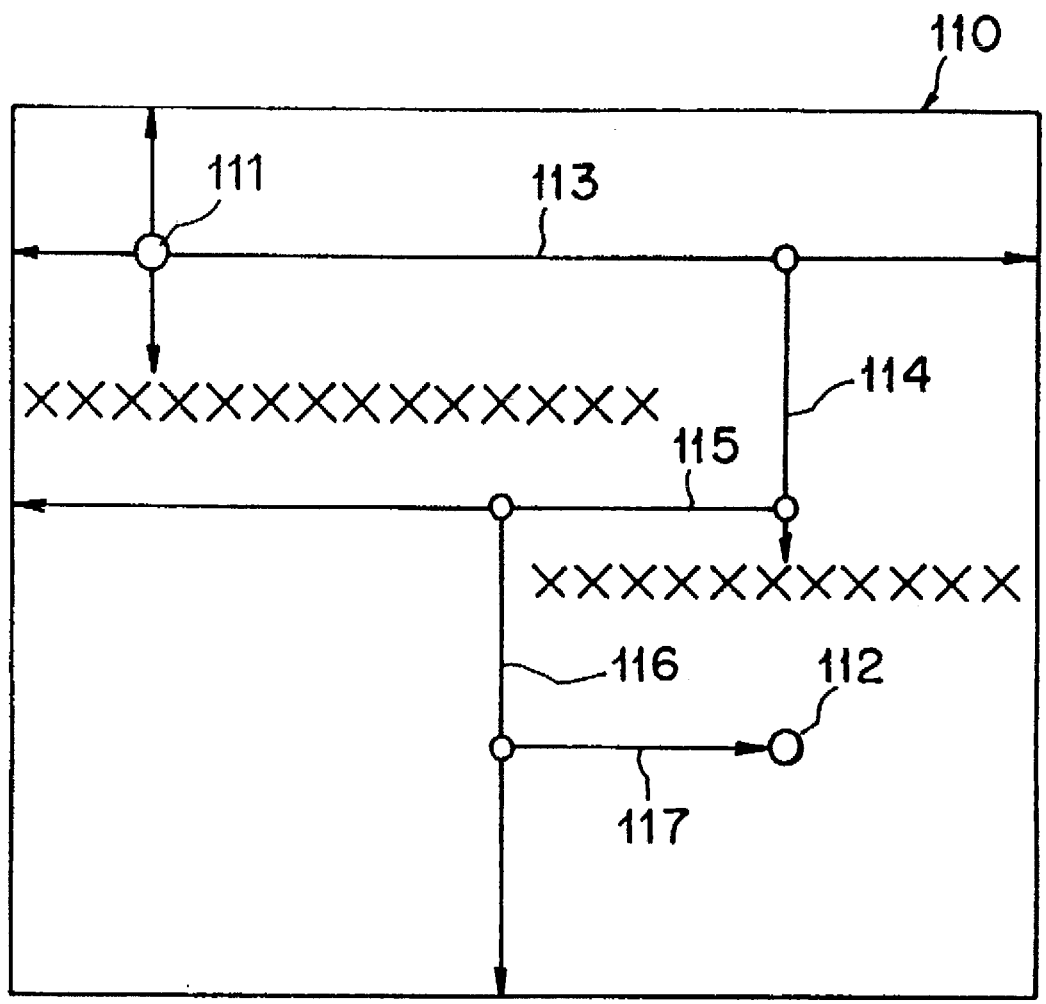
FIG. 35 is an illustration showing a general line search method.

Meanwhile, in the line search method shown in FIG. 35, routing patterns 81–84 are, in practice, expressed with strait lines termed segments, as shown in FIG. 32(A). Further, to efficiently access these strait lines, a printed circuit board 70 is, lengthwisely or breadthwisely, divided into bands to set links. No problem occurs in a pattern extending in parallel with the divided bands (called a pattern in a main routing direction) as routing patterns 81–83, but a pattern extending in a direction at right angles to the divided bands (a pattern in a sub routing direction) as a routing pattern 84 needs to be expressed by divided into the segments. Once a main routing direction is decided with respect to a certain layer, it is impossible to express efficiently a pattern perpendicular to the main routing direction. That is, it is necessary to divide a pattern in the sub routing direction into a number of segments to express it.

Figure 31:
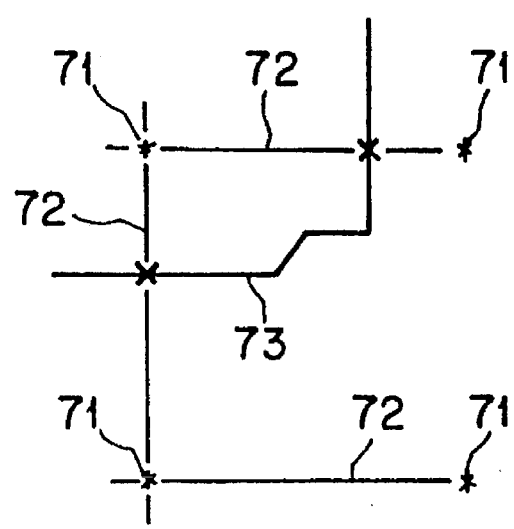
FIG. 31 is an illustration showing the operation of the automatic routing apparatus according to the second embodiment.
Figure 32:
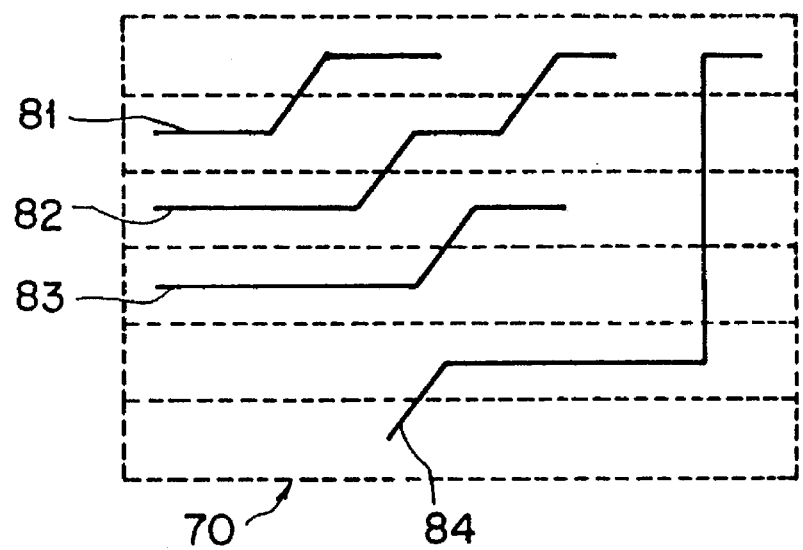
FIGS. 32(A) and 32(B) are illustrations showing the operation of the automatic routing apparatus according to the second embodiment.
Figure 32:
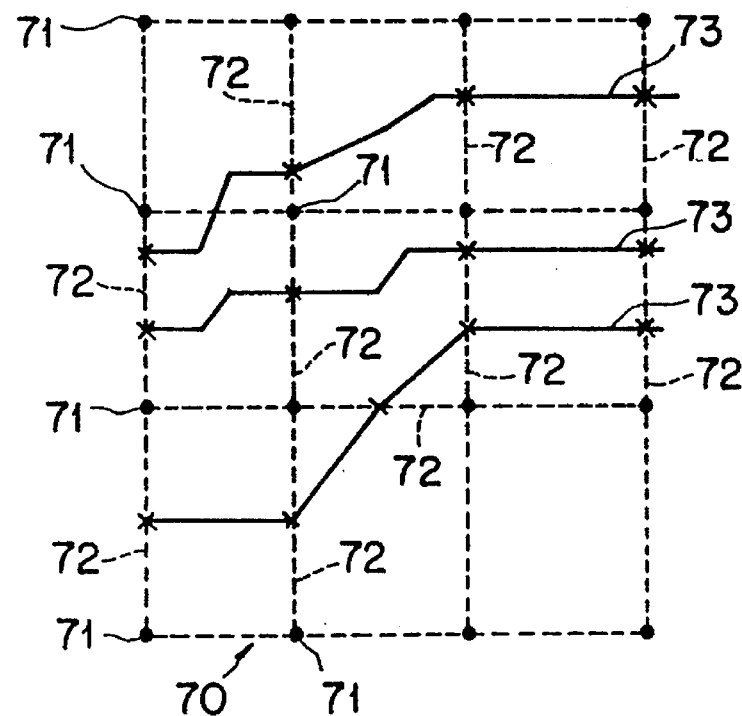
Figure 33:
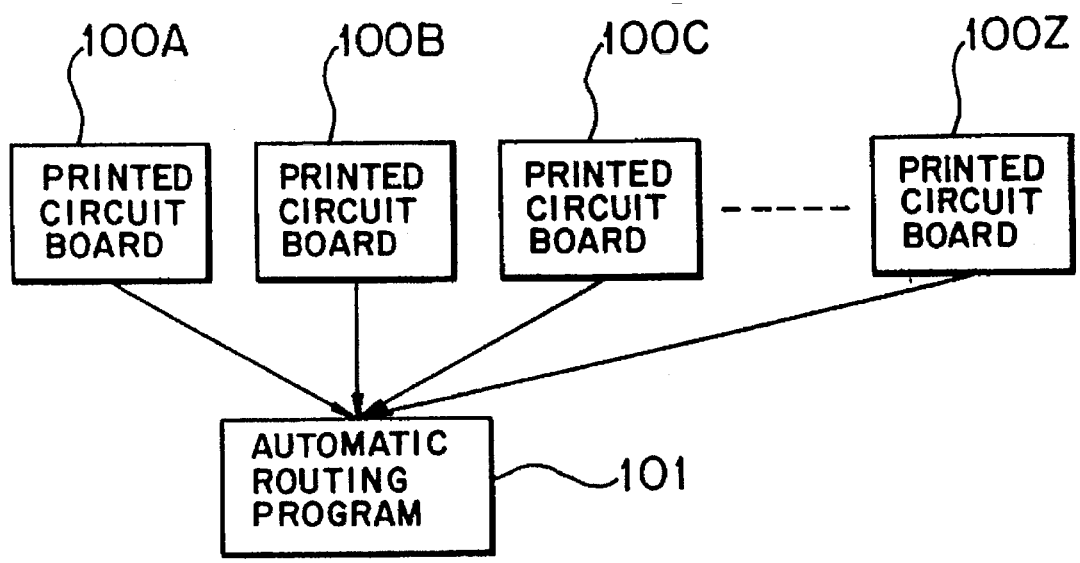
FIG. 33 is an illustration showing a general automatic routing technique.
Figure 34:
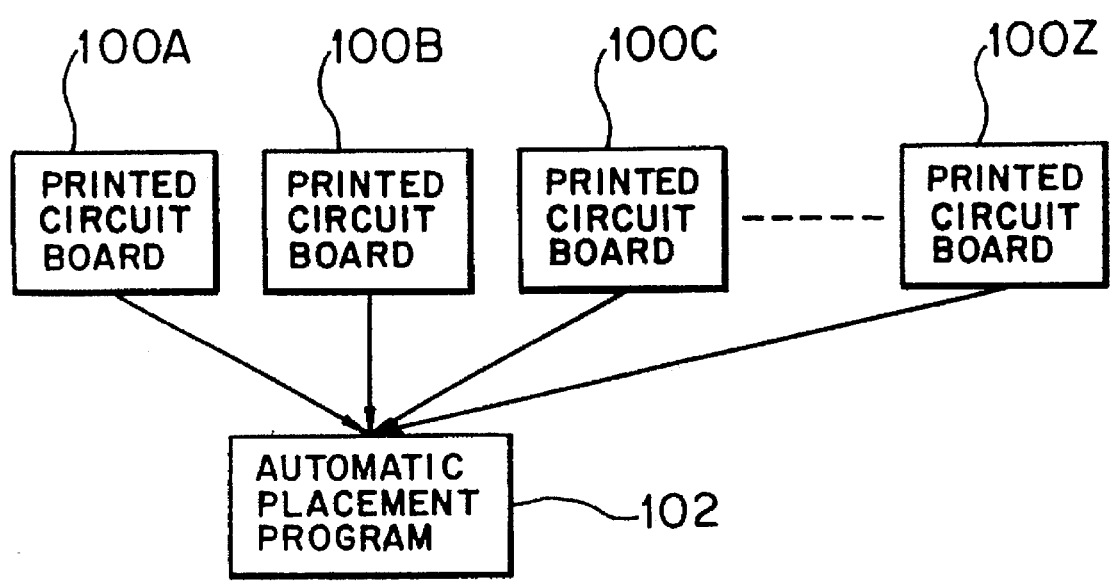
FIG. 34 is an illustration showing a general automatic placement technique.

The automatic routing apparatus 60 of this embodiment does not divide the region into bands as shown in FIGS. 31 or 32(B) so that it is possible to express a routing pattern (routing path 73) without distinction between the main routing direction and the sub routing direction, and to search routing paths without distinction between the horizontal direction and the vertical direction.

As above, the second embodiment of this invention may largely decrease a time period required to search routing paths, thus increasing the number of searches within a given period of time, and realizing extremely high-density automatic routing.

The automatic routing function according to the second embodiment may be used as one of the routing fundamental functions in the first embodiment stated hereinbefore.

As having been described in the above embodiments examples where an automatic routing and automatic placement are implemented on a printed circuit board, it is noted that this invention should not be limited to the above examples, but applicable to designs of semiconductor integrated circuits (LSI), multichip modules (MCM) and the like. In which case, the present invention may bring the same advantages as the above embodiments.

What is claimed is:

1. A routing method for composing a routing processing procedure on the basis of predetermined routing design data to generate a routing in the placement of a plurality of components on at least a circuit board, comprising the steps of:

composing the routing processing procedure by selecting a routing approach in a communication mode; and evaluating routing efficiency to generate said routing program, wherein said routing program is used in the placement of said plurality of components on at least a circuit board based on at least one of the sizes, types and power consumption of said components.

2. A routing method according to claim 1, wherein in a stage of an electrical device package design based on said predetermined routing design data, said routing approach is selected and said routing processing procedure is composed as a result of said electrical device package design.

3. A routing method according to claim 2, wherein said routing approach is prepared, in advance, as a plurality of routing fundamental process steps.

4. A routing method according to claim 3, wherein said routing processing procedure is designated in a routing control language when said routing approach is selected.

5. A routing method according to claim 4, wherein routed object information, routed place information, routing condition information, and routing order information are designated as said routing control language.

6. A routing method according to claim 2, wherein said routing processing procedure is designated in a routing control language when said routing approach is selected.

7. A routing method according to claim 6, wherein routed object information, routed place information, routing condition information, and routing order information are designated as said routing control language.

8. A routing method according to claim 1, wherein said routing approach is prepared, in advance, as a plurality of routing fundamental process steps.

9. A routing method according to claim 8, wherein said routing processing procedure is designated in a routing control language when said routing approach is selected.

10. A routing method according to claim 9, wherein routed object information, routed place information, routing condition information, and routing order information are designated as said routing control language.

11. A routing method according to claim 1, wherein said routing processing procedure is designated in a routing control language when said routing approach is selected.

12. A routing method according to claim 11, wherein routed object information, routed place information, routing condition information, and routing order information are designated as said routing control language.

13. A routing program generating apparatus for composing a routing processing procedure on the basis of predetermined design data to generate a routing program for use in the placement of a plurality of components on at least a circuit board, comprising:

a routing efficiency evaluating means for evaluating routing efficiency depending on a routing approach on the basis of said predetermined routing design data;

a display means for displaying a result of evaluation made by said routing efficiency evaluating means; and a selecting means for selecting the routing approach, wherein said selecting means selects the routing approach in a communication mode while said result of the evaluation displayed on said display means is consulted to compose the routing processing procedure, thereby generating said routing program, wherein said routing proqram is used in the placement of said plurality of components on at least a circuit board.

14. A routing program generating apparatus according to claim 13, wherein in a stage of a packaging design based on said predetermined routing design data, said selecting means selects said routing approach to compose said routing processing procedure as a result of said package design.

15. A routing program generating apparatus according to claim 14, wherein said routing approach is prepared, in advance, as a plurality of routing fundamental process steps.

16. A routing program generating apparatus according to claim 15 further comprising:

a designating means for designating the routing processing procedure in a routing control language when said selecting means selects said routing approach.

17. A routing program generating apparatus according to claim 16, wherein said designating means designates routed object information, routed place information, routing condition information and routing order information as said routing control language to designate the routing processing procedure.

18. A routing program generating apparatus according to claim 14 further comprising:

a designating means for designating the routing processing procedure in a routing control language when said selecting means selects said routing approach.

19. A routing program generating apparatus according to claim 18, wherein said designating means designates routed object information, routed place information, routing condition information and routing order information as said routing control language to designate the routing processing procedure.

20. A routing program generating apparatus according to claim 13, wherein said routing approach is prepared in advance, as a plurality of routing fundamental process steps.

21. A routing program generating apparatus according to claim 20 further comprising:

a designating means designating the routing processing procedure in a routing control language when said selecting means selects said routing approach.

22. A routing program generating apparatus according to claim 21, wherein said designating means designates routed object information, routed place information, routing condition information and routing order information as said routing control language to designate the routing processing procedure.

23. A routing program generating apparatus according to claim 13 further comprising:

a designating means for designating the routing processing procedure in a routing control language when said selecting means selects said routing approach.

24. A routing program generating apparatus according to claim 23, wherein said designating means designates routed object information, routed place information, routing condition information and routing order information as said routing control language to designate a routing processing procedure.

25. A placement method for use in the placement of a plurality of components on at least a circuit board, comprising the steps of:

when placing said plurality of components within a placed region on the basis of predetermined design dam, designating component placement processing procedures according to placement control information depending on said predetermined design data and said placed region; and combining said designated component placement processing procedures to generate a placement program for automatically placing said plurality of components within said placed region based on at least one of the sizes, types and power consumption of said components.

26. A placement method according to claim 25, wherein placed component grouping information, placed region designating information, placing condition information and group placing order information are designated as said placement control information.

27. A placement apparatus for automatically placing a plurality of components within a placed region of at least a circuit board on the basis of predetermined design data comprising:

a designating means for designating component placement processing procedures according to placement control information depending on said predetermined design data and said placed region, said placement processing procedures designated by said designating means being combined to generate a placement program for automatically placing said plurality of components within said placed region of at least a circuit board based on at least one of the sizes, types and power consumption of said components.

28. A placement program generating apparatus according to claim 27, wherein said designating means designates placed component grouping information, placed region designating information, placing condition information and group placing order information as said placement control information.

29. An automatic routing method for deciding a routing path of a routing pattern in order to automatically route said routing pattern on a circuit board having a number of component pins comprising the steps of:

defining a straight line connecting component pins adjacent to each other as a chord;

generating a wave for maze method routing from a start point of said routing path toward an end point of the same;

propagating said wave between said chords adjacent to each other;

successively storing positions of said chords through which said wave has passed until reaching said end point from said start point; and tracing said positions of said chords through which said wave has passed back to said start point from said end point when said wave reaches said end point to determine a routing path for said routing pattern.

30. An automatic routing method according to claim 29, wherein when said wave is propagated between said adjacent chords, the passing of said routing pattern is judged on the basis of a capacity between said component pins forming said chord.

31. An automatic routing method according to claim 30 further comprising the steps of:

calculating a total sum of a line width of a routing pattern passing through said chord in this wave propagation and line widths of routing patterns that have been permitted to pass through said chord up to this wave propagation;

comparing said total sum of line widths with a distance between said component pins forming said chord; and permitting said routing pattern to pass when said total sum of line widths is smaller than said distance.

32. An automatic routing method according to claim 31 further comprising the steps of:

when a plurality of routing patterns are permitted to pass through said chord, storing a position on said chord through which each of said plural routing patterns passes as a relative position on said chord.

33. An automatic routing method according to claim 32 further comprising the steps of:

when at least two routing patterns pass through said chords adjacent to each other, judging crossing of said routing patterns on the basis of relative positions of each of said routing patterns on said adjacent chords.

34. An automatic routing method according to claim 33 further comprising the steps of:

after all routing paths of said routing patterns on said circuit board have been decided, equally spacing said routing patterns passing through said chord between said component pins.

35. An automatic routing method according to claim 32 further comprising the steps of:

after all routing paths of said routing patterns on said circuit board have been decided, equally spacing said routing patterns passing through said chord between said component pins.

36. An automatic routing method according to claim 30 further comprising the steps of:

when a plurality of routing patterns are permitted to pass through said chord, storing a position on said chord through which each of said plural routing patterns passes as a relative position on said chord.

37. An automatic routing method according to claim 36 further comprising the steps of:

when at least two routing patterns pass through said chords adjacent to each other, judging crossing of said routing patterns on the basis of a relative positions of each of said routing patterns on said adjacent chords.

38. An automatic routing method according to claim 37 further comprising the steps of:

after all routing paths of said routing patterns on said circuit board have been decided, equally spacing said routing patterns passing through said chord between said component pins.

39. An automatic routing method according to claim 36 further comprising the steps of:

after all routing paths of said routing patterns on said circuit board have been decided, equally spacing said routing patterns passing through said chord between said component pins.

40. An automatic routing apparatus deciding a routing path of a routing pattern in order to automatically route said routing pattern on a circuit board having a number of component pins comprising:

a chord information forming means for forming positional information about a chord that is a straight line connecting said component pins adjacent to each other on the basis of positional information about said component pins; and a maze routing control means for generating a wave for maze method routing from a start point toward an end point of said routing path, propagating wave between said adjacent chords on the basis of information about said chords formed by said chord information forming means, successively storing positions of said chords through which said wave has passed until reaching said end point from said start point, and tracing said positions of said chords through which said wave has passed back to said start point from said end point when said wave reaches said end point to decide a routing path of said routing pattern.

41. An automatic routing apparatus according to claim 40 further comprising:

a passability judging means for judging the passing of said routing pattern on the basis of a capacity between said component pins forming said chord when said maze routing control means propagates said wave between said chords adjacent to each other.

42. An automatic routing apparatus according to claim 41, wherein said passability judging means comprises:

an adding means for calculating a total sum of a line width of a routing pattern passing through said chord in the wave propagation and line widths of routing patterns that have been permitted to pass through said chord up to the wave propagation;

a comparing means for comparing said total sum of line widths calculated by said adding means with a distance between said component pins forming said chord; and a judging means for permitting said routing pattern to pass if said comparing means judges that said total sum of line widths is smaller than said distance.

43. An automatic routing apparatus according claim 42, wherein when said passability judging means permits a plurality of routing patterns to pass through said chord, a position on said chord through which each of said routing patterns passes is stored as a relative position on said chord.

44. An automatic routing apparatus according to claim 43 further comprising:

a crossing judging means for judging, when at least two routing patterns pass through said chords adjacent to each other, crossing of said routing patterns on the basis of relative positions on said adjacent chords of each of said routing patterns.

45. An automatic routing apparatus according to claim 44 further comprising:

an equally spacing means for equally spacing said routing patterns between said component pins after said maze routing control means has decided all routing paths of said routing patterns on said circuit board.

46. An automatic routing apparatus according to claim 43 further comprising:

an equally spacing means for equally spacing said routing patterns between said component pins after said maze routing control means has decided all routing paths of said routing patterns on said circuit board.

47. An automatic routing apparatus according to claim 41, wherein when said passability judging means permits a plurality of routing patterns to pass through said chord, a position on said chord through which each of said routing patterns passes is stored as a relative position on said chord.

48. An automatic routing apparatus according to claim 47 further comprising:

a crossing judging means for judging, when at least two routing patterns pass through said chords adjacent to each other, crossing of said routing patterns on the basis of relative positions on said adjacent chords of each of said routing patterns.

49. An automatic routing apparatus according to claim 48 further comprising:

an equally spacing means for equally spacing said routing patterns between said component pins after said maze routing control means has decided all routing paths of said routing patterns on said circuit board.

50. An automatic routing apparatus according to claim 47 further comprising:

an equally spacing means for equally spacing said routing patterns between said component pins after said maze routing control means has decided all routing paths of said routing patterns on said circuit board.

* * * * *